United States Patent
Li et al.

(10) Patent No.: US 11,087,855 B2
(45) Date of Patent: Aug. 10, 2021

(54) SHIFT REGISTER UNIT AND DRIVING METHOD, GATE DRIVE CIRCUIT AND DISPLAY DEVICE

(71) Applicant: BOE Technology Group Co., Ltd., Beijing (CN)

(72) Inventors: Yongqian Li, Beijing (CN); Xuehuan Feng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/533,262

(22) Filed: Aug. 6, 2019

(65) Prior Publication Data

US 2020/0135286 A1    Apr. 30, 2020

(30) Foreign Application Priority Data

Oct. 24, 2018   (CN) .......................... 201811243774.1

(51) Int. Cl.
  *G09G 3/36*     (2006.01)
  *G11C 19/28*    (2006.01)

(52) U.S. Cl.
  CPC ........... *G11C 19/28* (2013.01); *G09G 3/3677* (2013.01); *G09G 2310/0283* (2013.01); *G09G 2310/0286* (2013.01)

(58) Field of Classification Search
  CPC .... G11C 19/28; G11C 19/287; G09G 3/3677; G09G 2310/0283; G09G 2310/0286; G09G 2310/08; G09G 2330/023; G09G 2310/061; G09G 2320/0209
  USPC .............................. 345/98, 100, 204; 377/79
  See application file for complete search history.

(56) References Cited

U.S. PATENT DOCUMENTS

2015/0317954 A1*  11/2015  Jang .......................... G09G 5/18
                                                                345/213
2020/0184873 A1*   6/2020  Zheng ..................... G11C 19/28

FOREIGN PATENT DOCUMENTS

| CN | 105047119 B | | 1/2018 |
| CN | 108648718 | * | 1/2018 |
| CN | 108648686 A | | 10/2018 |
| CN | 108648716 A | | 10/2018 |
| CN | 108648718 A | | 10/2018 |
| CN | 108682397 A | | 10/2018 |
| CN | 108682398 A | | 10/2018 |

(Continued)

OTHER PUBLICATIONS

Aug. 17, 2020—(CN) First Office Action Appn 201811243774.1 with English Translation.

*Primary Examiner* — Jennifer T Nguyen
(74) *Attorney, Agent, or Firm* — Banner & Witcoff, Ltd.

(57) ABSTRACT

A shift register unit, a gate drive circuit, a display device and a driving method are disclosed. The shift register unit includes a first input circuit, a second input circuit, an output circuit and an anti-crosstalk circuit. The first input circuit is configured to input a first input signal to a first node; the second input circuit is configured to input a second input signal to the first node in a situation where the second node is at a first level and to stop inputting the second input signal to the first node in a situation where the second node is at a second level; the output circuit is configured to output or not output an output signal; the anti-crosstalk circuit is configured to prevent a level of the second node from becoming the first level in a situation where the second node is at the second level.

16 Claims, 8 Drawing Sheets

(56) References Cited

FOREIGN PATENT DOCUMENTS

KR       100919717 B1    10/2009
WO    2007080813 A1    7/2007

\* cited by examiner

SHIFT REGISTER UNIT AND DRIVING METHOD, GATE DRIVE CIRCUIT AND DISPLAY DEVICE

CROSS REFERENCE TO RELATED APPLICATIONS

The present application claims priority of Chinese Patent Application No. 201811243774.1 filed on Oct. 24, 2018, the disclosure of which is incorporated herein by reference in its entirety as part of the present application.

TECHNICAL FIELD

Embodiments of the present disclosure relate to a shift register unit and a driving method, a gate drive circuit and a display device.

BACKGROUND

In the field of display technology, a pixel array in a liquid crystal display panel or an organic light emitting diode (OLED) display panel generally includes a plurality of rows of gate lines and a plurality of columns of data lines intersecting the gate lines. The driving of the gate lines can be realized by a gate drive circuit. The gate drive circuit is typically integrated in a gate drive chip (Gate IC). An area of the chip in IC design is the main factor affecting the cost of the chip, and how to effectively reduce the area of the chip is a problem that technology developers need to consider.

SUMMARY

At least some embodiments of the present disclosure provide a shift register unit which includes a first input circuit, a second input circuit, an output circuit and an anti-crosstalk circuit. The first input circuit is connected with a first node and configured to input a first input signal to the first node in response to a first control signal; the second input circuit is connected with the first node, and configured to input a second input signal to the first node in a situation where a second node is at a first level and to stop inputting the second input signal to the first node in a situation where the second node is at a second level; the output circuit is connected with the first node, and configured to output or not output an output signal to an output terminal under control of a level of the first node; and the anti-crosstalk circuit is connected with the second node, and is configured to prevent a level of the second node from becoming the first level in a situation where the second node is at the second level.

For example, in the shift register unit provided by some embodiments of the present disclosure, the anti-crosstalk circuit includes a first transistor and a phase inverter. The phase inverter is connected with a gate electrode of the first transistor and the second node, is between the gate electrode of the first transistor and the second node, and is configured to generate an inverted signal according to the level of the second node and to apply the inverted signal to the gate electrode of the first transistor; and a first electrode of the first transistor is connected with the second node, a second electrode of the first transistor is connected with a first voltage terminal to receive a first voltage, and the first transistor is configured to be turned on under control of the inverted signal generated in a situation where the second node is at the second level.

For example, in the shift register unit provided by some embodiments of the present disclosure, the phase inverter includes a first invert transistor and a second invert transistor. A gate electrode of the first invert transistor and a first electrode of the first invert transistor are electrically connected with each other, and are configured to be connected with a second voltage terminal to receive a second voltage, and a second electrode of the first invert transistor is connected with the gate electrode of the first transistor; and a gate electrode of the second invert transistor is connected with the second node, a first electrode of the second invert transistor is connected with the gate electrode of the first transistor, and a second electrode of the second invert transistor is connected with the first voltage terminal to receive the first voltage.

For example, in the shift register unit provided by some embodiments of the present disclosure, the phase inverter includes a first invert transistor, a second invert transistor, a third invert transistor and a fourth invert transistor. A gate electrode of the first invert transistor is connected with a first electrode of the third invert transistor, a first electrode of the first invert transistor is connected with a second voltage terminal to receive a second voltage, and a second electrode of the first invert transistor is connected with the gate electrode of the first transistor; a gate electrode of the second invert transistor is connected with the second node, a first electrode of the second invert transistor is connected with the gate electrode of the first transistor, and a second electrode of the second invert transistor is connected with the first voltage terminal to receive the first voltage; a gate electrode of the third invert transistor and a second electrode of the third invert transistor are electrically connected with each other, and are configured to be connected with the second voltage terminal to receive the second voltage; and a gate electrode of the fourth invert transistor is connected with the second node, a first electrode of the fourth invert transistor is connected with a first electrode of the third invert transistor, and a second electrode of the fourth invert transistor is connected with the first voltage terminal to receive the first voltage.

For example, in the shift register unit provided by some embodiments of the present disclosure, the anti-crosstalk circuit includes a first transistor; a gate electrode of the first transistor is connected with the second node, a first electrode of the first transistor is connected with the second node, and a second electrode of the first transistor is connected with a first voltage terminal to receive a first voltage, and the first transistor is configured to be turned on in a situation where the second node is at the second level.

For example, in the shift register unit provided by some embodiments of the present disclosure, the second input circuit includes a charging sub-circuit, a storage sub-circuit and an isolation sub-circuit. The charging sub-circuit is connected with the second node and configured to input a second control signal to the second node in response to a third clock signal; the storage sub-circuit is connected with the second node and configured to store a level of the second control signal input by the charging sub-circuit; and the isolation sub-circuit is connected with the second node and the first node, and configured to input the second input signal to the first node under control of the first level of the second node and a second clock signal.

For example, in the shift register unit provided by some embodiments of the present disclosure, the charging sub-circuit includes a second transistor, a gate electrode of the second transistor is connected with a third clock signal terminal to receive the third clock signal, a first electrode of the second transistor is connected with a blanking control terminal to receive the second control signal, and a second electrode of the second transistor is connected with the second node; the storage sub-circuit includes a first capacitor, a first terminal of the first capacitor is connected with the second node, and a second terminal of the first capacitor is connected with a first voltage terminal to receive a first voltage; and the isolation sub-circuit includes a third transistor and a fourth transistor, a gate electrode of the third transistor is connected with the second node, a first electrode of the third transistor is connected with a fourth clock signal terminal to receive a fourth clock signal which is used as the second input signal, a second electrode of the third transistor is connected with a first electrode of the fourth transistor, a gate electrode of the fourth transistor is connected with a second clock signal terminal to receive the second clock signal, and a second electrode of the fourth transistor is connected with the first node.

For example, in the shift register unit provided by some embodiments of the present disclosure, the first input circuit includes a fifth transistor. A gate electrode of the fifth transistor is connected with a display control terminal to receive the first control signal, a first electrode of the fifth transistor is connected with a second voltage terminal to receive a second voltage which is used as the first input signal, and a second electrode of the fifth transistor is connected with the first node.

For example, in the shift register unit provided by some embodiments of the present disclosure, the output terminal includes a shift output terminal and at least one scan signal output terminal.

For example, in the shift register unit provided by some embodiments of the present disclosure, the output circuit includes a sixth transistor, a seventh transistor and a second capacitor. A gate electrode of the sixth transistor is connected with the first node, a first electrode of the sixth transistor is connected with a first clock signal terminal to receive a first clock signal which is used as the output signal, and a second electrode of the sixth transistor is connected with the shift output terminal; and a gate electrode of the seventh transistor is connected with the first node, a first electrode of the seventh transistor is connected with the first clock signal terminal to receive the first clock signal which is used as the output signal, and a second electrode of the seventh transistor is connected with the at least one scan signal output terminal; a first terminal of the second capacitor is connected with the first node, and the second terminal of the second capacitor is connected with the shift output terminal.

For example, the shift register unit provided by some embodiments of the present disclosure further includes a first node noise reduction circuit, a display reset circuit, a third node control circuit and an output noise reduction circuit. The first node noise reduction circuit is configured to perform noise reduction on the first node under control of a level of a third node; the display reset circuit is configured to reset the first node in response to a display reset signal; the third node control circuit is configured to control the level of the third node under control of the level of the first node; the output noise reduction circuit is configured to perform noise reduction on the output terminal under the control of the level of the third node.

For example, the shift register unit provided by some embodiments of the present disclosure further includes a blanking reset circuit. The blanking reset circuit is configured to reset the first node in response to a blanking reset signal.

For example, the shift register unit provided by some embodiments of the present disclosure further includes a first node electricity-leakage prevention circuit. The first node electricity-leakage prevention circuit is configured to control a level of a first electricity-leakage prevention node under the control of the level of the first node.

For example, the shift register unit provided by some embodiments of the present disclosure further includes a second node electricity-leakage prevention circuit. The second node electricity-leakage prevention circuit is configured to control a level of a second electricity-leakage prevention node in a situation where the second node is at the first level, to reduce electricity-leakage of the second node via the second input circuit and the anti-crosstalk circuit.

At least some embodiments of the present disclosure also provide a gate drive circuit including a plurality of cascaded shift register units, each of which is provided by any one of the embodiments of the present disclosure.

For example, in the gate drive circuit provided by an embodiment of the present disclosure, a display control terminal of an (n+2)th stage of shift register unit is connected with a shift output terminal of an (n)th stage of shift register unit; a blanking control terminal of an (n+1)th stage of shift register unit is connected with the shift output terminal of the (n)th stage of shift register unit, wherein n is an integer greater than zero.

At least some embodiments of the present disclosure also provide a display device including the gate drive circuit provided by any one of the embodiments of the present disclosure.

At least some embodiments of the present disclosure also provide a driving method of a shift register unit which includes: preventing the level of the second node from becoming the first level by the anti-crosstalk circuit in a situation where the second node is at the second level.

For example, the driving method of the shift register unit provided by some embodiments of the present disclosure further includes: inputting the second input signal to the first node by the second input circuit in a situation where the second node is at the first level; stopping inputting the second input signal to the first node in a situation where the second node is at the second level; and outputting the output signal to the output terminal under control of the level of the first node.

For example, the driving method of the shift register unit provided by some embodiments of the present disclosure further includes: inputting the first input signal to the first node by the first input circuit in response to the first control signal; and outputting the output signal to the output terminal under the control of the level of the first node.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
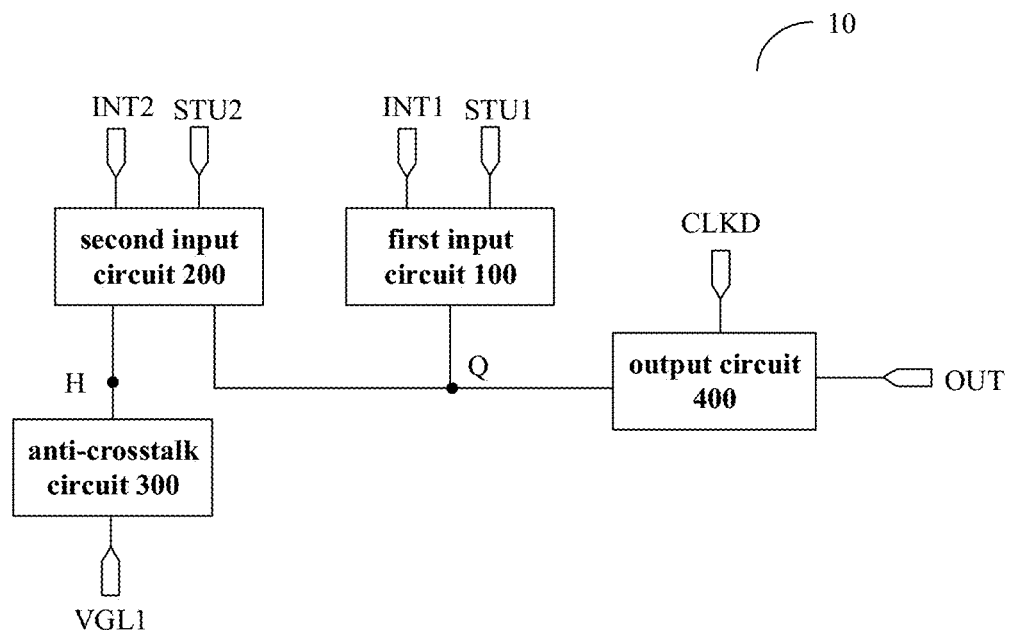
FIG. 1 is a schematic diagram of a shift register unit according to some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The disclosure is described below with reference to a few specific embodiments. In order to keep the following description of the embodiments of the present disclosure clear and concise, detailed descriptions of known functions and known components may be omitted. When any component of the embodiments of the present disclosure appears in more than one of the drawings, the component is denoted by the same or similar reference numerals in the drawings.

In a common OLED display panel, a sub-pixel unit is based on, for example, a 2T1C (including a scan transistor, a drive transistor and a capacitor) pixel circuit, and needs a compensation technique to improve display quality. When compensating the sub-pixel unit in the OLED display panel, in addition to providing a pixel compensation circuit in the sub-pixel unit for internal compensation, external compensation may also be performed by providing a sense transistor, a sensing line and a sensing processing circuit. When the external compensation is performed, a gate drive circuit including shift register units needs to supply drive signals for the scan transistor and the sense transistor to the sub-pixel unit in the display panel; for example, a scan drive signal (i.e., a display output signal) for the scan transistor is provided in a display period (Display) of one frame, and a sensing drive signal (i.e., a blanking output signal) for the sense transistor is provided in a blanking period (Blank) of one frame.

For the OLED display panel, a kind of the shift register unit of the gate drive circuit includes a first input circuit that controls a scan drive signal to be output during the display period and a second input circuit that controls a sensing drive signal to be output during the blanking period; the shift register unit may output an output pulse of a composite waveform including two waveforms having different widths and timings, thereby providing the scan drive signal and the sensing drive signal for the scan transistor and the sense transistor, respectively. For example, the second input circuit includes a control node for controlling whether the second input signal is input to a pull-up node. In a situation where the control node is in a floating state, such as at a turn-off level (e.g., a low level), the level of the control node is prone to be affected by a second input signal (e.g., a clock signal) and/or high levels of other signals to generate crosstalk, which causes the level of the control node to change from the low level to a high level, so that the second input signal is erroneously input to the pull-up node, causing misoperation and affecting the display quality of the display panel.

At least one embodiment of the present disclosure provides a shift register unit including a first input circuit, a second input circuit, an output circuit and an anti-crosstalk circuit. The first input circuit is connected with a first node and configured to input a first input signal to the first node in response to a first control signal; the second input circuit is connected with the first node, and configured to input a second input signal to the first node in a situation where a second node is at a first level and to stop inputting the second input signal to the first node in a situation where the second node is at a second level; the output circuit is connected with the first node, and configured to output or not output an output signal to an output terminal under control of a level of the first node; the anti-crosstalk circuit is connected with the second node, and is configured to prevent a level of the second node from becoming the first level in a situation where the second node is at the second level. The embodiments of the present disclosure also provide a gate drive circuit, a display device and a driving method corresponding to the shift register unit described above.

The shift register unit provided by the above embodiment of the present disclosure can ensure that the level of the second node is not affected by the second input signal and/or other signals and thus is not converted to the first level in a situation where the second node (for example, a control node herein) is in a floating state (for example, being at the second level), so as to avoid inputting the second input signal to the first node under the control of the first level of the second node, it is correspondingly avoided that the output of the gate drive circuit including the shift register unit is abnormal, and the structure stability of the gate drive circuit including the shift register unit and the display quality of the display panel are improved.

Embodiments of the present disclosure and examples thereof will be described in detail below with reference to the accompanying drawings.

FIG. 1 is a schematic diagram of the shift register unit according to some embodiments of the present disclosure. As shown in FIG. 1, the shift register unit 10 may include the first input circuit 100, the second input circuit 200, the anti-crosstalk circuit 300 and the output circuit 400. By cascading a plurality of the shift register units 10, the gate drive circuit may be obtained, and the gate drive circuit is configured for driving a display panel such as a liquid crystal display panel or an organic light emitting diode display panel, configured for sequentially providing scan signals to a plurality of gate lines of the display panel, so as to perform progressive or interlaced scanning or the like while the display panel displays one frame.

As shown in FIG. 1, the first input circuit 100 is connected with a first node Q (e.g., a pull-up node herein) and is configured to input a first input signal to the first node Q in response to a first control signal. For example, in some examples, the first input circuit 100 is connected with a first input signal terminal INT1 or a separately provided voltage terminal (e.g., a high voltage terminal for providing a high-level signal), a display control terminal STU1 and the first node Q, and the first input circuit 100 is configured to be turned on under control of the first control signal provided by the display control terminal STU1, so that the first input signal terminal INT1 or the separately provided voltage terminal is connected with the first node Q, so that the first input signal provided by the first input signal terminal INT1 or the high-level signal provided by the separately provided voltage terminal is input to the first node Q, so as to pull up an electric potential of the first node Q to an operating electric potential.

The second input circuit 200 is connected with the first node Q and configured to input a second input signal to the first node Q in a situation where a second node H is at a first level (e.g., a high level), and configured to stopping inputting the second input signal to the first node Q in a situation where the second node H is at a second level (e.g., a low level). For example, the second input circuit 200 is electrically connected with a blanking control terminal STU2, a second input signal terminal INT2 and the first node Q, and the second input circuit 200 is configured to receive a second control signal provided by the blanking control terminal STU2, to store the second control signal to the second node H, and to output the second input signal provided by the second input signal terminal INT2 to the first node Q under the control of a level (the second control signal) of the second node H in a blanking period of one frame, so as to pull up the electric potential of the first node Q to the operating electric potential.

For example, in some examples, the second input circuit 200 may receive the second control signal in a display period of one frame, store the second control signal to the second node H, and output the second input signal to the first node Q according to the level (namely the stored second control signal) of the second node H in the blanking period of this frame, so as to pull up the electric potential of the first node Q to the operating electric potential. For example, in other examples, the second input circuit 200 may receive the second control signal in the blanking period of one frame, store the second control signal to the second node H, and output the second input signal to the first node Q according to the level (i.e., the stored second control signal) of the second node H in the blanking period of the next frame, so as to pull up the electric potential of the first node Q to the operating electric potential.

In the shift register unit 10 provided by the embodiments of the present disclosure, the first input circuit 100 (implemented as a display scan sub-circuit), the output circuit 400 and the second input circuit 200 (implemented as a detection sub-circuit) are integrated; in a case where the gate drive circuit obtained by cascading the plurality of the shift register units 10 is used to drive the display panel, a blanking scan signal in the blanking period of one frame and a display scan signal in the display period can be output through the same output circuit. That is, the first input circuit 100 and the second input circuit 200 can share a same output circuit 400 to realize the output of the output signal, thereby simplifying the circuit structure of the shift register unit and the gate drive circuit obtained from the shift register unit, reducing the size of the shift register unit and the size of the gate drive circuit including the shift register unit, and satisfying the requirements of high resolution and narrow bezel.

For example, in this example, a first clock signal provided by a first clock signal terminal CLKD is a composite signal, for example, the first clock signal may include a first output signal (the display scan signal) outputted in the display period and a second output signal (the blanking scan signal) outputted in the blanking period. For example, the first output signal and the second output signal may be two waveforms that are independent of each other and have different widths and timings. For example, during the display period of one frame, the output circuit 400 outputs the first output signal via the output terminal OUT under the control of the level of the first node Q, to drive a scan transistor for data input in a corresponding pixel unit through a gate line which is connected with the output circuit 400, and thus to perform display; and during the blanking period of one frame, the output circuit 400 outputs the second output signal via the output terminal OUT under the control of the level of the first node Q, to drive a sense transistor for compensation detection in the pixel unit, and thus to perform compensation detection.

Figure 5:
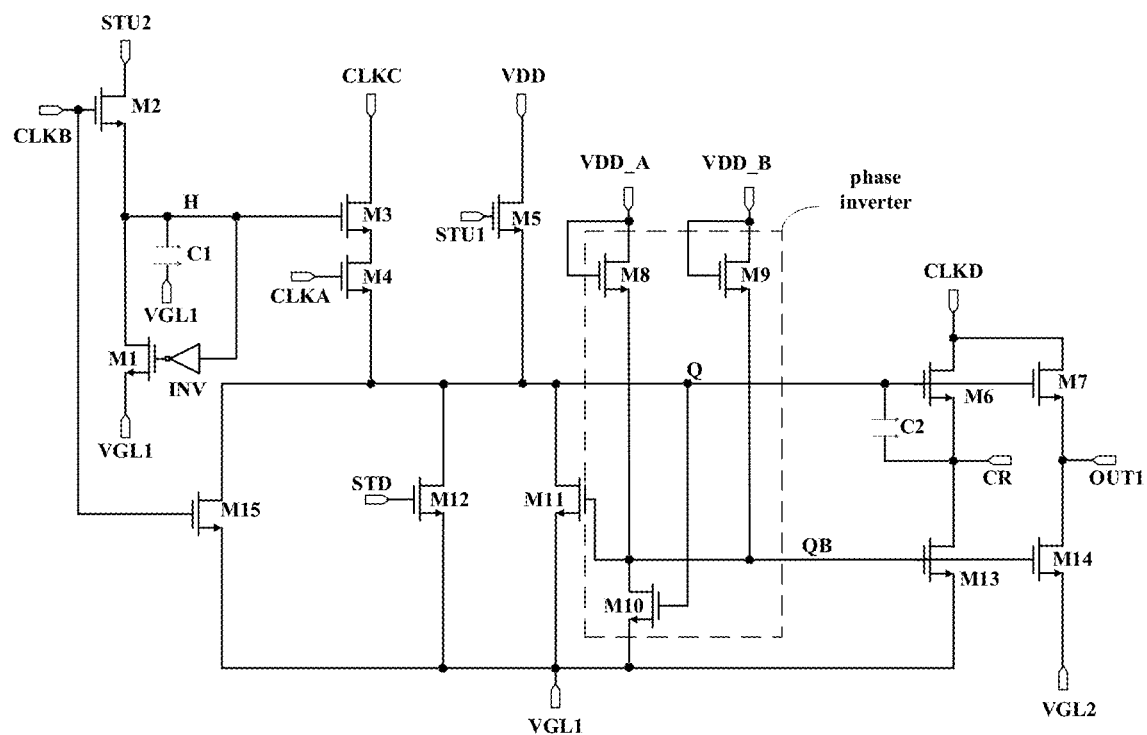
FIG. 5 is a circuit schematic diagram showing a specific implementation example of the shift register unit as shown in FIG. 3.

The anti-crosstalk circuit 300 is configured to prevent the level of the second node H from changing into the first level in a situation where the second node H is at the second level. For example, in a situation where the second node H is at the second level, that is, in a situation where the second node H is in a floating state, the level of the second node H is easily to convert to the first level or other levels close to the first level or the like under influence of the second input signal (for example, a fourth clock signal CLKC as shown in FIG. 5) and/or other signals (for example, a second clock signal CLKA as shown in FIG. 5). The embodiments of the present disclosure are not limited to this case.

For example, the anti-crosstalk circuit 300 is connected with the second node H and a first voltage terminal VGL1 (e.g., a low voltage terminal), and is configured to be turned on in a situation where the second node H is at the second level, so that the second node H is connected with the first voltage terminal VGL1, and thus the level of the second node H can be prevented from being converted to the first level or other levels under the influence of other signals (for example, the second clock signal CLKA and the fourth clock signal CLKC as shown in FIG. 5). Therefore, the anti-crosstalk circuit 300 can avoid the occurrence of the above-described crosstalk phenomenon.

It should be noted that in the embodiments of the present disclosure, the first level of the second node H is a turn-on level, and the second level of the second node H is a turn-off level. A value of the first level and a value of the second level may be determined according to a specific situation. For example, in a situation where a transistor connected with the second node H is an N-type transistor, the first level is a high level, and the second level is a low level; or, in a situation where the transistor connected with the second node H is a P-type transistor, the first level is a low level and the second level is a high level.

The output circuit 400 includes an output terminal OUT, is connected with the first node Q and is configured to output an output signal to the output terminal OUT under the control of the level of the first node Q. For example, in some examples, the output circuit 400 is connected with the first node Q, the output terminal OUT and the first clock signal terminal CLKD, and is configured to be turned on under the control of the level of the first node Q, such that the first clock signal provided by the first clock signal terminal CLKD serves as the output signal and is output to the output terminal OUT. Alternatively, in other examples, the output circuit 400 is connected with a separately provided voltage terminal (for example, a high voltage terminal), and uses the clock signal provided by the first clock signal terminal CLKD as a control signal to control whether the voltage terminal is connected with the output terminal, and thus to control whether the voltage signal of the voltage terminal is transmitted to the output terminal OUT and output as the output signal at the output terminal OUT.

For example, the output terminal OUT includes a shift output terminal CR and at least one scan signal output terminal, and the output terminal OUT outputs the output signal which is, for example, the first clock signal provided by the first clock signal terminal CLKD to the shift output terminal and the scan signal output terminal, so as to improve the driving ability of the shift register unit 10. For example, the at least one scan signal output terminal includes one scan signal output terminal. For example, the shift output terminal CR is configured for providing the first input signal, the second input signal (described below) and a reset signal to a next stage of shift register unit 10, and the scan signal output terminal is configured for providing a drive signal to pixel circuits in a row of pixel units in the display panel. For example, the shift output terminal CR and the scan signal output terminal output a same output signal. It should be noted that, in other examples, in a situation where a plurality of scan signal output terminals are included, the scan signal output terminals may output different output signals, and the specific settings are determined according to actual conditions, which is not limited in the embodiments of the present disclosure.

The shift register unit provided by the above embodiments of the present disclosure can ensure that the level of the second node is not affected by the second input signal and/or other signals and thus is not converted to the first level in a situation where the second node (for example, the control node herein) is in a floating state (for example, being at the second level), so as to avoid inputting the second input signal to the first node under the control of the first level of the second node, it is correspondingly avoided that the output of the gate drive circuit including the shift register unit is abnormal, and the structure stability of the gate drive circuit including the shift register unit and the display quality of the display panel are improved.

Figure 2:
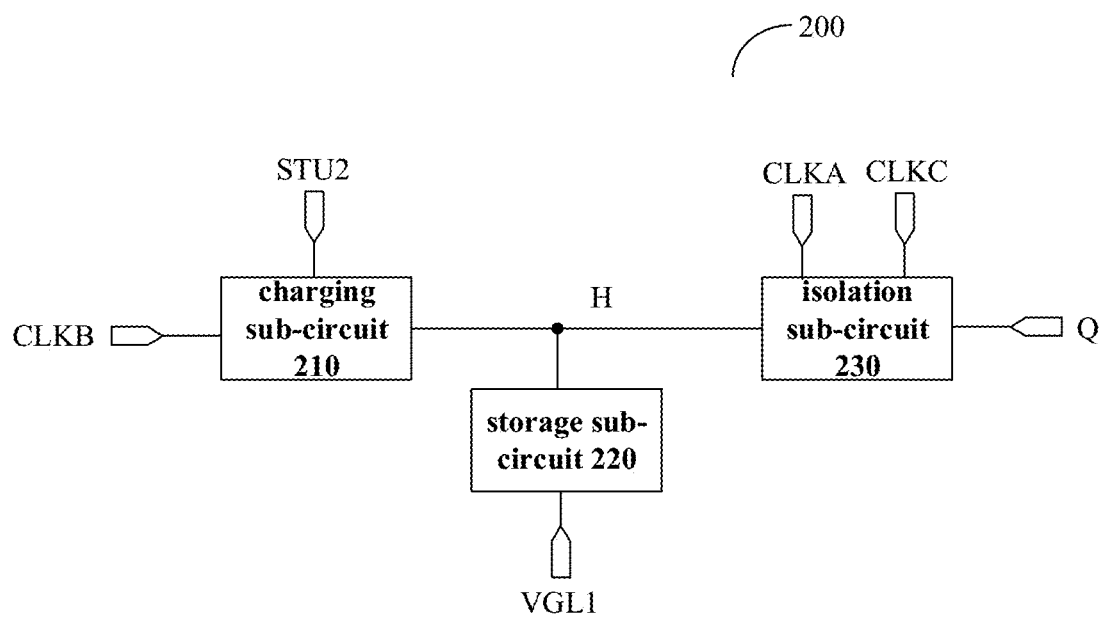
FIG. 2 is a schematic diagram of an exemplary second input circuit according to some embodiments of the present disclosure.

FIG. 2 is a schematic diagram of an example of the second input circuit provided by some embodiments of the present disclosure. As shown in FIG. 2, the second input circuit 200 includes a charging sub-circuit 210, a storage sub-circuit 220 and an isolation sub-circuit 230.

As shown in FIG. 2, the charging sub-circuit 210 is connected with the second node H and is configured to input the second control signal to the second node H in response to a third clock signal. For example, in a situation where the second control signal is the first level, the second node H is at the first level. For example, the charging sub-circuit 210 is connected with a third clock signal terminal CLKB, the blanking control terminal STU2 and the second node H, and is configured to be turned on under control of the third clock signal provided by the third clock signal terminal CLKB, so that the blanking control terminal STU2 and the second node H are electrically connected with each other to write the second control signal to the second node H. For example, in an example, the charging sub-circuit 210 is turned on under control of the third clock signal, and the second node H is charged (e.g., the second node H is pulled up) in a situation where the second control signal is a high level.

The storage sub-circuit 220 is connected with the second node H and is configured to store a level of the second control signal input by the charging sub-circuit 220. For example, another terminal of the storage sub-circuit 220 is also connected with the first voltage terminal VGL1 to store the level of the second control signal. It should be noted that another terminal of the storage sub-circuit 220 may also be connected with the isolation sub-circuit 230, which is not limited in the embodiments of the present disclosure.

The isolation sub-circuit 230 is connected with the second node H and the first node Q, and is configured to input the second input signal to the first node Q under the control of the level of the second node H and the second clock signal. For example, the isolation sub-circuit 230 is connected with the second node H, the first node Q, a fourth clock signal terminal CLKC (i.e., the second input signal terminal INT2) and a second clock signal terminal CLKA, and the isolation sub-circuit 230 is configured to be turned on under a cooperative control of the level of the second node H and the second clock signal provided by the second clock signal terminal CLKA, so that the fourth clock signal terminal CLKC is electrically connected with the first node Q, thereby inputting the fourth clock signal (i.e., the second input signal) to the first node Q. For example, in some examples, the isolation sub-circuit 230 is turned on under the cooperative control of the level of the second node H and the second clock signal, and the first node Q can be charged in a situation where the fourth clock signal is a high level.

It should be noted that, in the embodiments of the present disclosure, the second input circuit 200 may include any applicable sub-circuit, and is not limited to the above-described charging sub-circuit 210, storage sub-circuit 220 and isolation sub-circuit 230, as long as the corresponding function can be realized.

The first input circuit and the output circuit included in the shift register unit as shown in FIG. 1 may be implemented in various forms, such as a basic structure of 4T1C (four transistors and one capacitor). In different implementations, the shift register unit may further include other functional modules such as noise reduction functional module, electricity-leakage prevention functional module, etc. For example, the description may be referred to below, and embodiments of the present disclosure are not limited to these specific forms.

Figure 3:
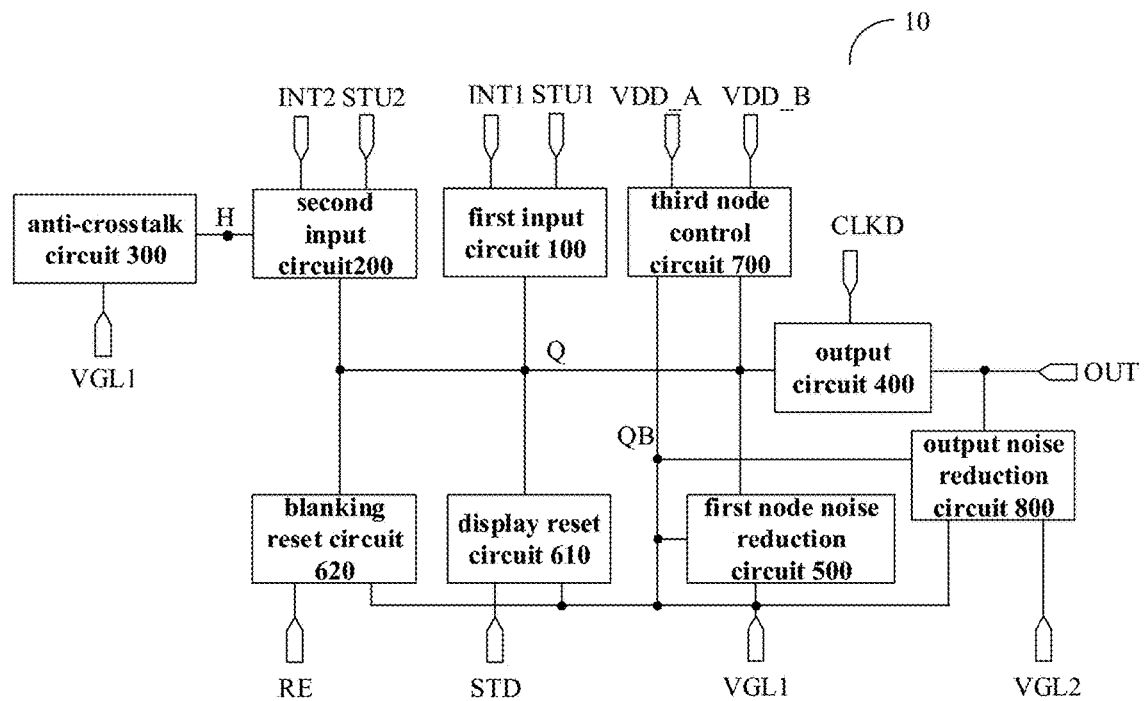
FIG. 3 is a schematic diagram of another shift register unit according to some embodiments of the present disclosure.

FIG. 3 is a schematic block diagram of another shift register unit according to some embodiments of the present disclosure. As shown in FIG. 3, on the basis of the shift register unit as shown in FIG. 1, in some examples, the shift register unit 10 further includes a first node noise reduction circuit 500, a display reset circuit 610, a third node control circuit 700 and an output noise reduction circuit 800; and in other examples, the shift register unit 10 also includes a blanking reset circuit 620. It should be noted that structures of the other circuits of the shift register unit 10 as shown in FIG. 3 is substantially the same as structures of the shift register unit 10 as shown in FIG. 1, and the repeated portions are not described again.

The first node noise reduction circuit 500 is connected with the first node Q and a third node QB (for example, in a situation where the first node Q is a pull-up node, the third node QB is a pull-down node), and the first node noise reduction circuit 500 is configured to perform noise reduction on the first node Q under control of a level of the third node QB. For example, the first node noise reduction circuit 500 is connected with the first node Q, the third node QB, and the first voltage terminal VGL1 or a separately provided voltage terminal (e.g., a low voltage terminal), and the first node noise reduction circuit 500 is configured to be turned on in a situation where the third node QB is, for example, at a high level, so that the first node Q is connected with the first voltage terminal VGL1 or the separately provided voltage terminal, so as to pull down the electric potential of the first node Q to a low level, and thus to achieve to perform noise reduction on the first node Q.

The display reset circuit 610 is connected with the first node Q and is configured to reset the first node Q in response to a display reset signal. For example, the display reset circuit 610 is connected with a display reset signal terminal STD, the first node Q, and the first voltage terminal VGL1 or a separately provided voltage terminal (for example, a low voltage terminal), and the display reset circuit 610 is configured to be turned on under control of the display reset signal provided by the display reset signal terminal STD, so that the first node Q is electrically connected with the first voltage terminal VGL1 or the separately provided voltage terminal (for example, the low voltage terminal), thereby resetting the first node Q. For example, in the display period of one frame, after the output circuit 400 completes to output a signal, the first node Q is reset by the display reset circuit 610.

The blanking reset circuit 620 is connected with the first node Q and is configured to reset the first node Q in response to a blanking reset signal. For example, the blanking reset circuit 620 is connected with a blanking reset signal terminal RE, the first voltage terminal VGL1 and the first node Q, and the blanking reset circuit 620 is configured to be turned on under control of the blanking reset signal provided by the blanking reset signal terminal RE, so that the first node Q is electrically connected with the first voltage terminal VGL1 or the separately provided voltage terminal (for example, the low voltage terminal) to reset the first node Q. For example, in the blanking period of one frame, after the output circuit 400 completes to output the signal, the first node Q is reset by the blanking reset circuit 620.

The third node control circuit 700 is connected with the first node Q and the third node QB, and is configured to control the level of the third node QB under control of the level of the first node Q. For example, the third node control circuit 700 is connected with a third voltage terminal VDD_A, a fourth voltage terminal VDD_B, the first voltage terminal VGL1 (e.g., a low voltage terminal), the first node Q and the third node QB; the third node control circuit 700 is configured to allow the third node QB to be connected with the first voltage terminal VGL1 or the separately provided voltage terminal (for example, the low voltage terminal) in a situation where the first node Q is, for example, at a high level, thereby pulling down the third node QB to a low level; and the third node control circuit 700 is configured to allow the third node QB is connected with one of the third voltage terminal VDD_A and the fourth voltage terminal VDD_B in a situation where the first node Q is at a low level, thereby pulling up the third node QB to a high level. For example, the third node control circuit 700 may be a phase inverter. For example, the third voltage terminal VDD_A and the fourth voltage terminal VDD_B may be set to be alternately input with a high level, that is, the fourth voltage terminal VDD_B is input with a low level in a situation where the third voltage terminal VDD_A is input with a high level, and the fourth voltage terminal VDD_B is input with a high level in a situation where the third voltage terminal VDD_A is input with a low level, so that transistors respectively connected with the third voltage terminal VDD_A and the fourth voltage terminal VDD_B can alternately operate, to extend the service life of these transistors. For example, in other examples, the third voltage terminal VDD_A and the fourth voltage terminal VDD_B may be replaced by clock signal terminals that alternately provide a high level (in a situation where the transistors are P-type, the clock signal terminals alternately provide a direct-current low level). The embodiments of the present disclosure are not limited thereto.

The output noise reduction circuit 800 is connected with the third node QB and the output terminal OUT, and is configured to perform noise reduction on the output terminal OUT under control of the level of the third node QB. For example, the output noise reduction circuit 800 is connected with the third node QB, the first voltage terminal VGL1, a fifth voltage terminal VGL2 or a separately provided voltage terminal (for example, a low voltage terminal), and the output terminal OUT; and the output noise reduction circuit 800 is configured to be turned on in a situation where the third node QB is, for example, at a high level, so that the output terminal OUT is connected with the first voltage terminal VGL1, the fifth voltage terminal VGL2 or the separately provided voltage terminal, so as to achieve to perform noise reduction on the output terminal OUT.

Figure 4:
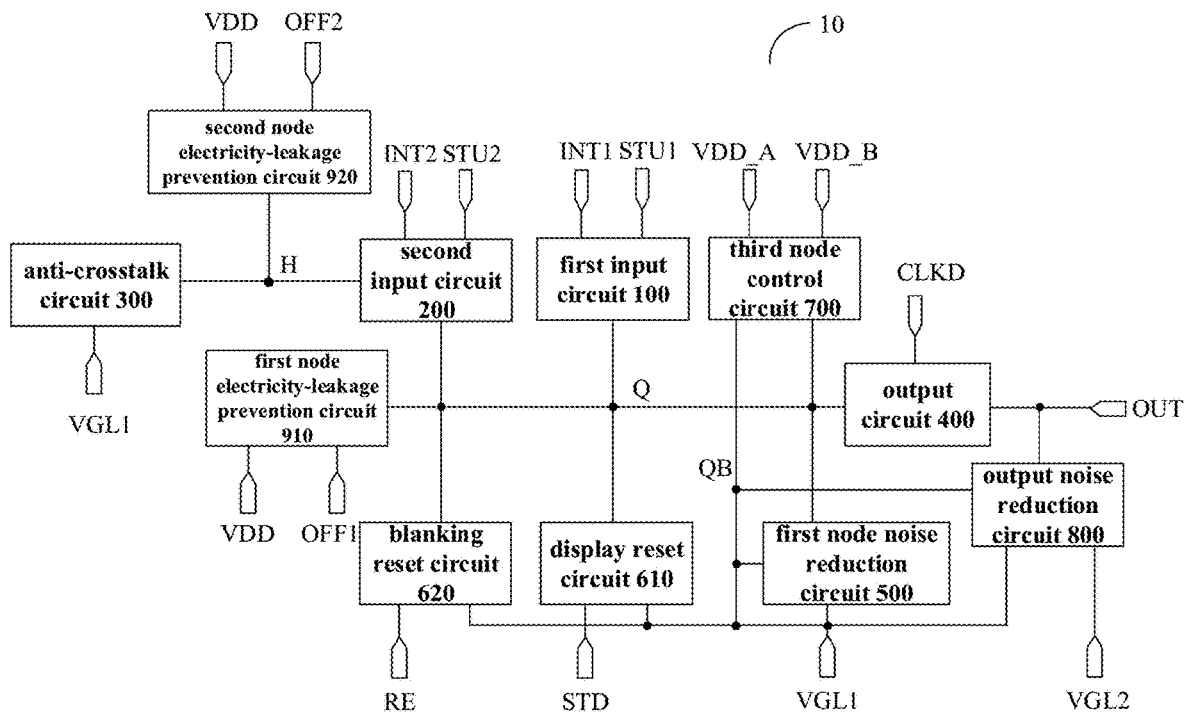
FIG. 4 is a schematic diagram of still another shift register unit according to some embodiments of the present disclosure.

FIG. 4 is a schematic block diagram of still another shift register unit according to some embodiments of the present disclosure. As shown in FIG. 4, on the basis of the shift register unit as shown in FIG. 3, the shift register unit 10 in this embodiment further includes a first node electricity-leakage prevention circuit 910 and a second node electricity-leakage prevention circuit 920, and other structures is substantially identical to structures in the shift register unit 10 depicted in FIG. 3 and is not described again herein.

The first node electricity-leakage prevention circuit 910 is configured to control a level of a first electricity-leakage prevention node OFF1 under control of the level of the first node Q, so as to reduce the electricity-leakage of the first node Q via circuits (for example, the first input circuit 100, the isolation sub-circuit 230, the first node noise reduction circuit 500, the display reset circuit 610, and the blanking reset circuit 620 and the like) connected with the first node Q. For example, the first node electricity-leakage prevention circuit 910 is connected with the first node Q, the first electricity-leakage prevention node OFF1 and a second voltage terminal VDD (for example, a high voltage terminal), and the first node electricity-leakage prevention circuit 910 is configured to be turned on in a situation where the first node Q is, for example, at a high level, so that the first electricity-leakage prevention node OFF1 is connected with the second voltage terminal VDD. For example, the first node electricity-leakage prevention circuit 910 is turned on in response to a high level of the first node Q, so that a difference between voltages of two terminals (the first node Q and the first electricity-leakage prevention node OFF1) of the circuit connected with the first node electricity-leakage prevention circuit 910 becomes small, and for example, the voltages are all high level, thereby avoiding the electricity-leakage of the level of the first node Q after charging through the circuits connected with the first node Q.

The second node electricity-leakage prevention circuit 920 is configured to control a level of a second electricity-leakage prevention node OFF2 in a situation where the second node H is at the first level, so as to reduce the electricity-leakage of the second node H via the second input circuit 200 (e.g., the charging sub-circuit 210) and the anti-crosstalk circuit 300. For example, the second node electricity-leakage prevention circuit 920 is connected with the second node H, the second electricity-leakage prevention node OFF2 and the second voltage terminal VDD (for example, the high voltage terminal), and the second node electricity-leakage prevention circuit 920 is configured to be turned on in a situation where the second node H is, for example, at a high level, so that the second electricity-leakage prevention node OFF2 is connected with the second voltage terminal VDD. For example, the second node electricity-leakage prevention circuit 920 is turned on in response to a high level of the second node H, so that a difference between voltages of two terminals (the second node H and the second electricity-leakage prevention node OFF2) of the circuits (for example, the anti-crosstalk circuit 300 and the charging sub-circuit 210 of the second input circuit 200) connected with the second node electricity-leakage prevention circuit 920 becomes small, and for example, the voltages are all high level, thereby avoiding the electricity-leakage of the level of the second node H after charging through the circuits connected with the second node H.

For example, the first voltage terminal VGL1 is configured to provide a direct-current low-level signal (which is, for example, lower than or equal to a low level portion of the clock signal); for example, the first voltage terminal VGL1 is configured to be grounded; and the direct-current low-level signal herein is referred to as a first voltage, and the following embodiments are the same as this case, and will not be described again.

For example, the second voltage terminal VDD is configured to provide a direct-current high-level signal (which is, for example, higher than or equal to a high level portion of the clock signal); the direct-current high-level signal is referred to herein as a second voltage; and for example, the second voltage is greater than the first voltage. For example, the following embodiments are the same as this embodiment, and are not described again.

For example, the third voltage terminal VDD_A is configured to provide a direct-current high-level signal, the signal provided by the third voltage terminal VDD_A is referred to as a third voltage, the fourth voltage terminal VDD_B is also configured to provide a direct-current high-level signal, and the signal provided by the fourth voltage terminal VDD_B is referred to as a fourth voltage; and the following embodiments are the same as this embodiment, and will not be described again.

For example, the fifth voltage terminal VGL2 is configured to provide a direct-current low-level signal (which is, for example, lower than or equal to the low level portion of the clock signal); for example, the fifth voltage terminal VGL2 is grounded; and the direct-current low-level signal is referred to as a fifth voltage, and the following embodiments are the same as this embodiment and will not be described again. For example, in some examples, the fifth voltage of the fifth voltage terminal VGL2 is higher than the first voltage of the first voltage terminal VGL1. In other examples, the fifth voltage of the fifth voltage terminal VGL2 is equal to the first voltage of the first voltage terminal VGL1. The fifth voltage and the first voltage may be the same or different, which may be determined according to actual needs.

It should be noted that the "operating level" or "turn-on level" of the shift register unit provided in the embodiments of the present disclosure refers to a level capable of turning on an operated transistor included in the shift register unit, correspondingly "non-operating level" or "turn-off level" refers to a level incapable of turning on the operated transistor included in the shift register unit (i.e., the transistor is turned off). Depending on factors such as the type (N-type or P-type) of the transistor in the circuit structure of the shift register unit, the operating level may be higher or lower than the non-operating level, and the turn-on level may be higher or lower than the turn-off level. Generally, a square wave pulse signal is used by the shift register unit during operation, the operating level or the turn-on level corresponds to a level of a square wave pulse portion of the square wave pulse signal, and the non-operating level or the turn-off level corresponds to a level of a non-square wave pulse portion of the square wave pulse signal.

FIG. 5 is a circuit schematic diagram of a specific implementation example of the shift register unit of the embodiment as shown in FIG. 3, and the shift register unit of the embodiments as shown in other figures (e.g., FIG. 1 or FIG. 2) may be implemented in a same or similar manner. As shown in FIG. 5, the shift register unit 10 includes a first transistor to a fifteenth transistor M1-M15, and further includes a first capacitor C1 and a second capacitor C2. It should be noted that the following description is given by taking that each transistor is an N-type transistor as an example, but this case is not limitative to the embodiments of the present disclosure.

As shown in FIG. 5, in this example, in more detail, the anti-crosstalk circuit includes the first transistor M1 and a phase inverter INV. For example, in the example as shown in FIG. 5, the phase inverter INV is connected with and is between a gate electrode of the first transistor M1 and the second node H, and the phase inverter INV is configured to generate an inverted signal according to the level of the second node H and to apply the inverted signal to the gate electrode of the first transistor M1, so as to control the first transistor M1. A first electrode of the first transistor M1 is connected with the second node H, a second electrode of the first transistor M1 is connected with the first voltage terminal VGL1 to receive the first voltage, and the first transistor M1 is configured to be turned on under control of the inverted signal generated in a situation where the second node H is at the second level. For example, in a situation where the second node H is at the second level (for example, a low level), the phase inverter INV outputs a high level, and the first transistor M1 is turned on in response to the high level output by the phase inverter INV, so as to allow the second node H to be electrically connected with the first voltage terminal VGL1, so that the first voltage is written to the second node H, and the level of the second node H is held at the second level, so as to avoid that the second node H generates crosstalk (which refers to that, for example, the second level is changed to the first level or other level close to the first level), due to being affected by a parasitic capacitance in a situation where the second clock signal and/or the fourth clock signal are/is at a high level, to enable the isolation sub-circuit to be turned on to pull up the first node Q. For example, in a situation where the second node H is at the first level (e.g., a high level), the phase inverter outputs a low level, the first transistor M1 is turned off in response to the low level output by the phase inverter, and correspondingly the second node H is not electrically connected with the first voltage terminal VGL1, so that the second node H can remain at the first level and is not affected.

Figure 6A:
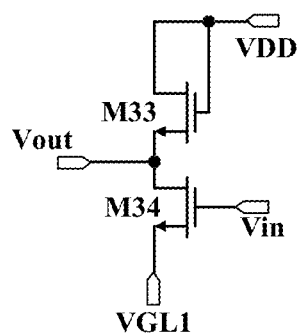
FIG. 6A is a circuit schematic diagram showing a specific implementation example of a phase inverter as shown in FIG. 5.

FIG. 6A is a circuit schematic diagram showing a specific implementation example of the phase inverter as shown in FIG. 5. In the example as shown in FIG. 6A, the phase inverter INV may be implemented as including a first invert transistor M33 and a second invert transistor M34. Here, the term "invert transistor" means a transistor of the phase inverter.

A gate electrode of the first invert transistor M33 and a first electrode of the first invert transistor M33 are electrically connected with each other, and are configured to be connected with the second voltage terminal VDD to receive the second voltage, and a second electrode of the first invert transistor M33 is used as an output terminal Vout of the phase inverter INV and is connected with the gate electrode of the first transistor M1. A gate electrode of the second invert transistor M34 is used as an input terminal Vin of the phase inverter INV and is connected with the second node H, a first electrode of the second invert transistor M34 is used as the output terminal Vout of the phase inverter INV and is connected with the gate electrode of first transistor M1, and a second electrode of the second invert transistor M34 is connected with the first voltage terminal VGL1 to receive the first voltage.

For example, the first invert transistor M33 is always in a turn-on state in response to the second voltage supplied by the second voltage terminal VDD, such that the first voltage supplied by the first voltage terminal VGL1 is output to the output terminal Vout of the phase inverter INV in a situation where the second invert transistor M34 is turned on in response to a turn-on level (e.g., the first level) of the second node H, and such that the second voltage supplied by the second voltage terminal VDD is output to the output terminal Vout in a situation where the second invert transistor M34 is turned off in response to a turn-off level (for example, the second level) of the second node H. For example, in a situation where the second node H is at the second level, that is, in a situation where the input terminal Vin of the phase inverter INV is input with a low level, the second invert transistor M34 is turned off, and the first invert transistor M33 is turned on in response to the second voltage provided by the second voltage terminal VDD and outputs the second voltage to the output terminal Vout of the phase inverter INV, that is, the high level is output to the gate electrode of the first transistor M1, so as to control the first transistor M1 to be turned on. For example, in a situation where the second node H is at the first level, that is, the input terminal Vin of the phase inverter INV is input with a high level, the second invert transistor M34 is turned on, and the first invert transistor M33 is always in a turn-on state in response to the second voltage supplied by the second voltage terminal VDD. For example, parameters (e.g., a width to length ratio of channel) of the first invert transistor M33 and the second invert transistor M34 are designed, such that in a situation where the second invert transistor M34 is turned on in response to the first level of the second node H, the output terminal Vout of the phase inverter INV is connected with the first voltage terminal VGL1 to be controlled to the first voltage (for example, a low voltage). Therefore, the phase inverter INV can realize an inverted output of the level of the second node H.

Figure 6B:
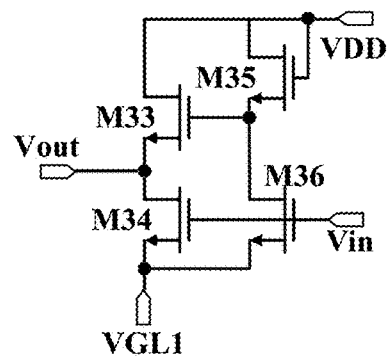
FIG. 6B is a circuit schematic diagram showing another specific implementation example of the phase inverter as shown in FIG. 5.

FIG. 6B is a circuit schematic diagram showing another specific implementation example of the phase inverter as shown in FIG. 5. In the example shown in FIG. 6B, the phase inverter INV may be implemented as including a first invert transistor M33 to a fourth invert transistor M36.

A gate electrode of the first invert transistor M33 is connected with a first electrode of the third invert transistor M35, a first electrode of the first invert transistor M33 is connected with the second voltage terminal VDD to receive the second voltage, and a second electrode of the first invert transistor M33 is used as the output terminal Vout of the phase inverter INV and is connected with the gate electrode of the first transistor M1. A gate electrode of the second invert transistor M34 is connected with the second node H, a first electrode of the second invert transistor M34 is used as the output terminal Vout of the phase inverter INV and is connected with the gate electrode of the first transistor M1, and a second electrode of the second invert transistor M34 is connected with the first voltage terminal VGL1 to receive the first voltage. A gate electrode of the third invert transistor M35 and a second electrode of the third invert transistor M35 are electrically connected with each other, and are configured to be connected with the second voltage terminal VDD to receive the second voltage. A gate electrode of the fourth invert transistor M36 is connected with the second node H, a first electrode of the fourth invert transistor M36 is connected with the first electrode of the third invert transistor M35, and a second electrode of the fourth invert transistor M36 is connected with the first voltage terminal VGL1 to receive the first voltage.

For example, the first invert transistor M33 is always in a turn-on state in response to the second voltage supplied by the second voltage terminal VDD, such that the first voltage supplied by the first voltage terminal VGL1 is output to the output terminal Vout in a situation where the second invert transistor M34 and the fourth invert transistor M36 are turned on in response to a turn-on level of the second node H, and such that the second voltage provided by the second voltage terminal VDD is output to the output terminal Vout in a situation where the second invert transistor M34 and the fourth invert transistor M36 are turned off in response to a turn-off level of the second node H.

For example, in a situation where the second node H is at the second level, that is, in a situation where the input terminal Vin of the phase inverter INV is input with a low level, the second invert transistor M34 and the fourth invert transistor M36 are turned off, and the third invert transistor M35 is turned on in response to the second voltage, so that the gate electrode of the first invert transistor M33 is at the second voltage, the first invert transistor M33 is turned on in response to the second voltage of the gate electrode, and outputs the second voltage to the output terminal Vout of the phase inverter INV, that is, a high level is output to the gate electrode of the first transistor M1, so as to control the first transistor M1 to be turned on. For example, in a situation where the second node H is at the first level, that is, in a situation where the input terminal Vin of the phase inverter INV is input with a high level, the second invert transistor M34 and the fourth invert transistor M36 are turned on, and the third invert transistor M35 is always in a turn-on state in response to the second voltage provided by the second voltage terminal VDD. For example, parameters (e.g., a width to length ratio of channel) of the third invert transistor M35 and the fourth invert transistor M36 are designed, such that in a situation where the fourth invert transistor M36 is turned on in response to the first level of the second node H, the gate electrode of the first invert transistor M33 is connected with the first voltage terminal VGL1 to be controlled at the first voltage (e.g., a low voltage), and thereby the first invert transistor M33 is controlled to be turned off, so as not to affect that the first voltage output provided by the first voltage terminal VGL1 is output to the output terminal Vout of the phase inverter INV in a situation where the second invert transistor M34 is turned on in response to the first level of the second node H. Therefore, the phase inverter INV can realize the inverted output of the level of the second node H.

Figure 7:
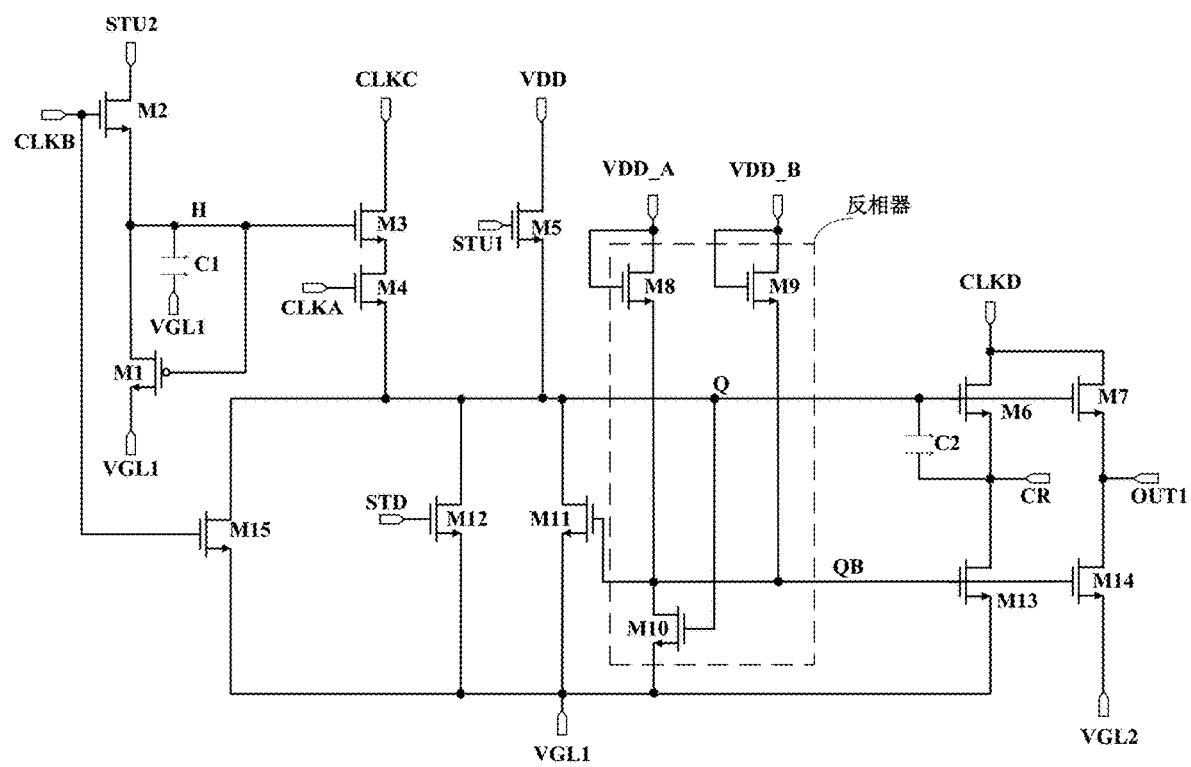
FIG. 7 is a circuit schematic diagram showing another specific implementation example of the shift register unit as shown in FIG. 3.

For example, in the example as shown in FIG. 7, the anti-crosstalk circuit includes the first transistor M1. For example, a gate electrode of the first transistor M1 is connected with the second node H, a first electrode of the first transistor M1 is connected with the second node H, and a second electrode of the first transistor M1 is connected with the first voltage terminal VGL1 to receive the first Voltage. For example, the first transistor M1 is configured to be turned on in a situation where the second node H is at the second level. For example, in a situation where the isolation sub-circuit 230 in the second input circuit 200 is implemented as an N-type transistor, the first transistor M1 may be a P-type transistor; or, in a situation where the isolation sub-circuit 230 in the second input circuit 200 is implemented as a P-type transistor, the first transistor M1 may be an N-type transistor. It should be noted that, in the embodiment of the present disclosure, descriptions are given by taking a case that the first transistor M1 is a P-type transistor as an example.

For example, in a situation where the second node H is at the second level (e.g., a low level), the first transistor M1 is turned on, so that the second node H is electrically connected with the first voltage terminal VGL1, thereby writing the first voltage into the first second node H, and the level of the second node H is held at the second level, so as to prevent the second node H from generating crosstalk (which refers to, for example, the level of the second node H is changed from the second level to the first level or other level) caused by the influence of the parasitic capacitance in a situation where the second clock signal and/or the fourth clock signal are/is at a high level, causing the isolation sub-circuit 230 to be turned on to pull up the first node Q. For example, in a situation where the second node H is at the first level, the first transistor M1 is turned off in response to the first level of the second node H, and accordingly the second node H is not electrically connected with the first voltage terminal VGL1, so that the second node H remains at the first level and is not affected.

The charging sub-circuit 210 may be implemented as a second transistor M2. For example, a gate electrode of the second transistor M2 is connected with the third clock signal terminal CLKB to receive the third clock signal, a first electrode of the second transistor M2 is connected with the blanking control terminal STU2 to receive the second control signal, and a second electrode of the second transistor M2 is connected with the second node H. In a situation where the third clock signal is at a valid level (e.g., a high level), the second transistor M2 is turned on, so that the blanking control terminal STU2 is electrically connected with the second node H, thereby writing the second control signal to the second node H. For example, in a situation where the second control signal is a high level, the second node H is charged.

The storage sub-circuit 220 may be implemented as the first capacitor C1. For example, a first terminal of the first capacitor C1 is connected with the second node H, and a second terminal of the first capacitor C1 is connected with the first voltage terminal VGL1 to receive the first voltage. After the high level of the second control signal is written to the second node H, the second node H is charged to the first level (e.g., a high level), and the first capacitor C1 stores the high level and maintains the second Node H at the second level for using in subsequent phases.

It should be noted that, in various embodiments of the present disclosure, the first capacitor C1 may be a capacitor device made by a process, for example, the capacitor device may be realized by forming special capacitor electrodes, and respective electrodes of the capacitor may be realized through a metal layer or a semiconductor layer (for example, doped polysilicon) or the like; and the first capacitor C1 may be a parasitic capacitance between respective devices, and may be realized by the transistor itself and other devices and circuits. The connection manner of the first capacitor C1 is not limited to the above-described manners, or may be other suitable connection manners as long as the first capacitor C1 can store the level written to the second node H. For example, in other examples, a first terminal of the first capacitor C1 is connected with the second node H, and a second terminal of the first capacitor C1 is connected with a position (e.g., a point where a second electrode of a third transistor M3 connects a first electrode of a fourth transistor M4 as described below) in the isolation sub-circuit 230; or, in other examples, the first electrode of the first capacitor C1 is connected with the second node H, and the second electrode of the first capacitor C1 is connected with an terminal (for example, the fourth clock signal terminal CLKC as described below) of the isolation sub-circuit 230.

The isolation sub-circuit 230 may be implemented as a third transistor M3 and a fourth transistor M4. For example, a gate electrode of the third transistor M3 is connected with the second node H, a first electrode of the third transistor M3 is connected with the fourth clock signal terminal CLKC to receive the fourth clock signal which is used as the second input signal, the second electrode of the third transistor M3 is connected with the first electrode of the fourth transistor M4, a gate electrode of the fourth transistor M4 is connected with the second clock signal terminal CLKA to receive the second clock signal, and a second electrode of the fourth transistor M4 is connected with the first node Q. In a situation where the second node H is at a high level and the second clock signal is also at a high level, the third transistor M3 and the fourth transistor M4 are both turned on, so that the fourth clock signal terminal CLKC is electrically connected with the first node Q, thereby the fourth clock signal is written to the first node Q, and an electric potential of the first node Q is pulled up to an operating electric potential.

The first input circuit 100 may be implemented as a fifth transistor M5. In the example as shown in FIG. 5, a gate electrode of the fifth transistor M5 is connected with the display control terminal STU1 to receive the first control signal, a first electrode of the fifth transistor M5 is connected with the second voltage terminal VDD (i.e., the first input terminal INT1) to receive the second voltage as the first input signal, and a second electrode of the fifth transistor M5 is connected with the first node Q. In a situation where the first control signal is a valid level (e.g., a high level), the fifth transistor M5 is turned on to electrically connect the second voltage terminal VDD with the first node Q, thereby writing the second voltage to the first node Q, and pulling up an electric potential of the first node Q to the operating electric potential. In other examples, the gate electrode of the fifth transistor M5 may be connected with the first electrode of the fifth transistor M5, and connected with the display control terminal STU1 to receive the first control signal, and the second electrode of the fifth transistor M5 is connected with the first node Q, which is not limited in the embodiments of the present disclosure.

For example, the output circuit 400 may be implemented as a sixth transistor M6, a seventh transistor M7 and the second capacitor C2. A gate electrode of the sixth transistor M6 is connected with the first node Q, a first electrode of the sixth transistor M6 is connected with the first clock signal terminal CLKD to receive the first clock signal as an output signal, and a second electrode of the sixth transistor M6 is connected with the shift output terminal CR. A gate electrode of the seventh transistor M7 is connected with the first node Q, a first electrode of the seventh transistor M7 is connected with the first clock signal terminal CLKD to receive the first clock signal as an output signal, and a second electrode of the seventh transistor M7 is connected with a scan signal output terminal OUT1. A first terminal of the second capacitor C2 is connected with the first node Q, and a second terminal of the second capacitor C2 is connected with the shift output terminal CR. It should be noted that, embodiments are not limited thereto; the shift register unit may include more output signals and scan signal output terminals corresponding to the output signals.

The third node control circuit 700 may be implemented as an eighth transistor M8, a ninth transistor M9 and a tenth transistor M10. A gate electrode of the eighth transistor M8 and a first electrode of the eighth transistor M8 are connected with each other, and are configured to be connected with the third voltage terminal VDD_A to receive the third voltage, and a second electrode of the eighth transistor M8 is connected with the third node QB. A gate electrode of the ninth transistor M9 and a first electrode of the ninth transistor M are connected with each other, and are configured to be connected with the fourth voltage terminal VDD_B to receive the fourth voltage, and a second electrode of the ninth transistor M9 is connected with the third node QB. A gate electrode of the tenth transistor M10 is connected with the first node Q, a first electrode of the tenth transistor M10 is connected with the third node QB, and a second electrode of the tenth transistor M10 is connected with the first voltage terminal VGL1 to receive the first voltage.

In a situation where the eighth transistor M8 or the ninth transistor M9 is turned on, the third voltage or the fourth voltage may charge the third node QB, so as to pull up an electric potential of the third node QB to a high level. In a situation where the electric potential of the first node Q is a high level, the tenth transistor M10 is turned on. For example, in a case where designing width to length ratios of channel of transistors, the tenth transistor M10 and the eighth transistor M8 (or the ninth transistor M9) may be designed to allow the level of the third node QB to be pulled down to a low level in a situation where both the tenth transistor M10 and the eighth transistor M8 (or the ninth transistor M9) are turned on, and the low level may allow that an eleventh transistor M11, a thirteenth transistor M13 and a fourteenth transistor M14 keep being turned off.

The first node noise reduction circuit 500 may be implemented as the eleventh transistor M11. A gate electrode of the eleventh transistor M11 is connected with the third node QB, a first electrode of the eleventh transistor M11 is connected with the first node Q, and a second electrode of the eleventh transistor M11 is connected with the first voltage terminal VGL1 to receive the first voltage. For example, in a situation where the third node QB is at a valid level (e.g., a high level), the eleventh transistor M11 is turned on to electrically connect the first node Q with the first voltage terminal VGL1, so as to perform noise reduction on the first node Q.

The display reset circuit 610 may be implemented as a twelfth transistor M12. A gate electrode of the twelfth transistor M12 is connected with the display reset terminal STD to receive the display reset signal, a first electrode of the twelfth transistor M12 is connected with the first node Q, and a second electrode of the twelfth transistor M12 is connected with the first voltage terminal VGL1 to receive the first voltage. For example, in the display period of one frame, in a situation where the display reset signal is a valid level (e.g., a high level), the twelfth transistor M12 is turned on to electrically connect the first node Q with the first voltage terminal VGL1, so that the first node Q is reset.

For example, the at least one scan signal output terminal includes one scan signal output terminal. For example, in a situation where the one scan signal output terminal is a first scan signal output terminal OUT1, the output noise reduction circuit 800 may be implemented as the thirteenth transistor M13 and the fourteenth transistor M14. A gate electrode of the thirteenth transistor M13 is connected with the third node QB, a first electrode of the thirteenth transistor M13 is connected with the shift output terminal CR, and a second electrode of the thirteenth transistor M13 is connected with the first voltage terminal VGL1 to receive the first voltage. A gate electrode of the fourteenth transistor M14 is connected with the third node QB, a first electrode of the fourteenth transistor M14 is connected with the first scan signal output terminal OUT1, and a second electrode of the fourteenth transistor M14 is connected with the fifth voltage terminal VGL2 to receive the fifth voltage.

For example, in a situation where the third node QB is at an valid level (for example, a high level), the thirteenth transistor M13 and the fourteenth transistor M14 are both turned on, so that the shift output terminal CR is electrically connected with the first voltage terminal VGL1, and the first scan signal output terminal OUT1 is electrically connected with the fifth voltage terminal VGL2, to perform noise reduction on the shift output terminal CR and the first scan signal output terminal OUT1.

It should be noted that, in various embodiments of the present disclosure, in a situation where a plurality of shift output terminals and a plurality of scan signal output terminals are included, the output noise reduction circuit 800 correspondingly includes a plurality of transistors which are correspondingly connected with the plurality of shift output terminals and/or the plurality of scan signal output terminals, to perform noise reduction on the plurality of shift output terminals and/or the plurality of scan signal output terminals.

The blanking reset circuit 620 may be implemented as a fifteenth transistor M15. For example, a gate electrode of the fifteenth transistor M15 is connected with the third clock signal terminal CLKB (i.e., the blanking reset terminal RE) to receive the third clock signal as the blanking reset signal, a first electrode of the fifteenth transistor M15 is connected with the first node Q, and a second electrode of the fifteenth transistor M15 is connected with the first voltage terminal VGL1 to receive the first voltage. For example, in the blanking period of one frame, in a situation where the third clock signal is at a valid level (e.g., a high level), the fifteenth transistor M15 is turned on to electrically connect the first node Q with the first voltage terminal VGL1, so that the first node Q is reset.

As described above, in the shift register unit 10 provided by the embodiments of the present disclosure, the electric potential of the second node H can be maintained by the first capacitor C1, and the electric potential of the first node Q can be maintained by the second capacitor C2. The first capacitor C1 and/or the second capacitor C2 may be a capacitor device formed by a process, for example, the capacitor device may be realized by forming special capacitor electrodes, and each electrode of the capacitor may be realized through a metal layer or a semiconductor layer (for example, doped polysilicon) or the like. Alternatively, the first capacitor C1 and/or the second capacitor C2 may be realized by a parasitic capacitance between the respective devices. The connection manners of the first capacitor C1 and/or the second capacitor C2 are/is not limited to the above described manners, or may be other suitable connection manners as long as the level written to the second node H or the first node Q can be stored. In a situation where the electric potential of the first node Q and/or the electric potential of the second node H are/is maintained at a high level, the first electrodes of some transistors (for example, the first transistor M1, the second transistor M2, the fourth transistor M4, the eleventh transistor M11, the twelfth transistor M12 and the fifteenth transistor M15) are connected with the first node Q and/or the second node H, and the second electrodes of these transistors are connected with a low-level signal. Even in a situation where the gate electrodes of these transistors are input with a turn-off signal, electricity-leakage may occur due to voltage differences between the first electrodes and the second electrodes, thereby causing that the shift register unit 10 has a poor effect of maintaining the electric potential of the node Q and/or the electric potential of the second node H.

For example, as shown in FIG. 5 or FIG. 7, taking the second node H as an example, the first electrode of the second transistor M2 is connected with the blanking control terminal STU1, and the second electrode is connected with the second node H. In a situation where the second node H is at a high level and the signal input to the blanking control terminal STU1 is a low level, the second node H may leak electricity through the second transistor M2. Similarly, the second node H may also leak electricity through the first transistor M1.

Figure 8:
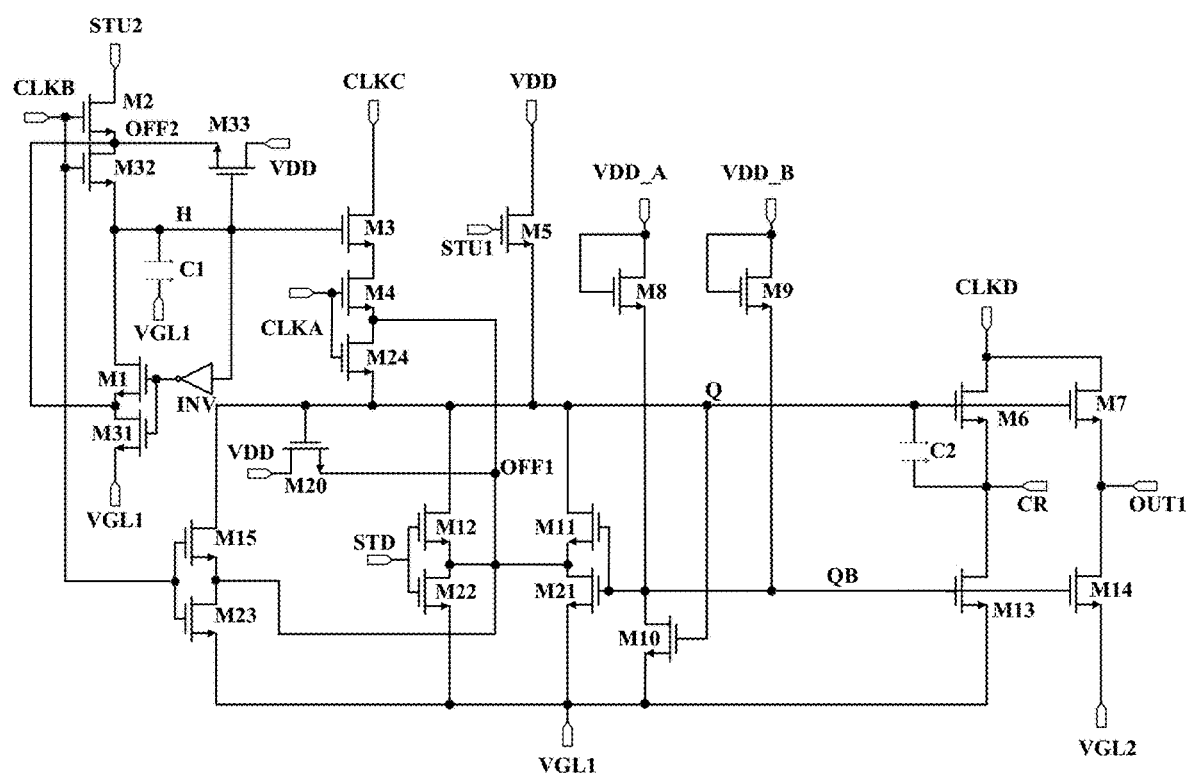
FIG. 8 is a circuit schematic diagram showing a specific implementation example of the shift register unit as shown in FIG. 4.

In response to the above defect, as shown in FIG. 8, a shift register unit 10 for electricity-leakage prevention is provided in an embodiment of the present disclosure. FIG. 8 is a circuit schematic diagram showing a specific implementation example of the shift register unit as shown in FIG. 4. As shown in FIG. 8, the shift register unit 10 is different from the shift register unit 10 of FIG. 5 in that a first electricity-leakage prevention transistor M21, a second electricity-leakage prevention transistor M22, a third electricity-leakage prevention transistor M23, a fourth electricity-leakage prevention transistor M24 and an eighth electricity-leakage prevention transistor M20, which are able to implement the first node electricity-leakage prevention circuit 910, are added, and a fifth electricity-leakage prevention transistor M31, a sixth electricity-leakage prevention transistor M32 and a seven electricity-leakage prevention transistor M37, which are able to implement the second node electricity-leakage prevention circuit 920, are added. Embodiments are not limited thereto, and the circuit structure for implementing the electricity-leakage prevention circuit can also be applied to the shift register unit as shown in FIG. 7. Next, the sixth electricity-leakage prevention transistor M32 will be taken as an example to explain the working principle of electricity-leakage prevention.

A gate electrode of the sixth electricity-leakage prevention transistor M32 is connected with the third clock signal terminal CLKB, a first electrode of the sixth electricity-leakage prevention transistor M32 is connected with the second electricity-leakage prevention node OFF2 (i.e., a point where the seventh electricity-leakage prevention transistor M37 is connected with the second electrode of the second transistor M2), and a second electrode of the sixth electricity-leakage prevention transistor M32 is connected with the second node H. A gate electrode of the seventh electricity-leakage prevention transistor M37 is connected with the first node H, and a first electrode of the seventh electricity-leakage prevention transistor M37 is connected with the second voltage terminal VDD to receive the second voltage with the high level. In a situation where the second node H is at a high level, the seventh electricity-leakage prevention transistor M37 is turned on under control of the level of the second node H, so that the high-level signal input by the second voltage terminal VDD can be input to the first electrode of the sixth electricity-leakage prevention transistor M32, such that the first electrode of the sixth electricity-leakage prevention transistor M32 and the second electrode of the sixth electricity-leakage prevention transistor M32 are both in a high level state, preventing the charge at the second node H from leaking through the second transistor M2. At this time, because the gate electrode of the sixth electricity-leakage prevention transistor M32 is connected with the gate electrode of the second transistor M2, the combination of the second transistor M2 and the sixth electricity-leakage prevention transistor M32 can achieve the same effect as the foregoing second transistor M2, and at the same time has the effect of preventing electricity-leakage.

Similarly, the combination of the fifth electricity-leakage prevention transistor M31 and the seventh electricity-leakage prevention transistor M37 can prevent the charge at the second node H from leaking through the fifth electricity-leakage prevention transistor M31 and the first transistor M1. Similarly, each of the first electricity-leakage prevention transistor M21 to the fourth electricity-leakage prevention transistor M24 can combine the eighth electricity-leakage prevention transistor M20 to realize an electricity-leakage prevention structure, so that the charge at the first node Q can be prevented from leaking. The working principle of preventing the first node Q from leaking electricity is the same as the above-mentioned working principle of preventing the second node H from leaking electricity, and details are not described herein again.

In an embodiment of the present disclosure, for example, in a situation where each circuit is implemented as an N-type transistor, the term "pull-up" means charging a node or an electrode of a transistor, so that an absolute value of the level of the node or the electrode is increased to achieve an operation (e.g., being turned on) of a corresponding transistor; and the term "pull-down" means discharging a node or an electrode of a transistor, so that the absolute value of the level of the node or the level of the electrode is lowered to achieve an operation (e.g. being turned off) of the corresponding transistor.

For another example, in a situation where each circuit is implemented as a P-type transistor, the term "pull-up" means discharging a node or an electrode of a transistor, so that the absolute value of the level of the node or the electrode is lowered to realize an operation (e.g., being turned on) of the corresponding transistor; and the term "pull-down" means charging a node or a electrode of a transistor, so that the absolute value of the level of the node or the electrode is increased to achieve an operation (e.g., being turned off) of the corresponding transistor.

It should be noted that in the description of various embodiments of the present disclosure, the first node Q, the second node H and the third node QB do not represent actual components, but represent meeting points of related electrical connections in circuit diagrams.

It should be noted that each transistor used in the embodiments of the present disclosure may be a thin film transistor, a field effect transistor or other switching device having the same characteristics. In the embodiments of the present disclosure, the thin film transistor is taken as an example for description. A source electrode and a drain electrode of the transistor used here may be structurally symmetrical, and thus the source electrode and the drain electrode may be structurally indistinguishable. In the embodiments of the present disclosure, in order to distinguish the source electrode and the drain electrode of the transistor except the gate electrode, it is directly described that one of the source electrode and the drain electrode is the first electrode and another of the source electrode and the drain electrode is the second electrode.

In addition, each transistor in the embodiments of the present disclosure is described by taking an N-type transistor as an example; in this case, the first electrode of the transistor is the drain electrode and the second electrode is the source electrode. It should be noted that the present disclosure includes but is not limited thereto. For example, one or more transistors in the shift register unit 10 provided by the embodiments of the present disclosure may adopt the P-type transistor; in this case, the first electrode of the transistor is the source electrode, and the second electrode is the drain electrode, as long as respective electrodes of the transistor of a selected type are connected in manners in accordance with the respective electrodes of a corresponding transistor in the embodiments of the present disclosure, and the respective voltage terminals are supplied with a corresponding high voltage or low voltage. In a situation where the N-type transistor is used, indium gallium zinc oxide (IGZO) may be used as an active layer of the thin film transistor, compared with using low temperature polysilicon (LTPS) or amorphous silicon (for example, hydrogenation amorphous silicon) as the active layer of the thin film transistor, the size of the transistor can be effectively reduced and electricity-leakage can be prevented.

Figure 9:
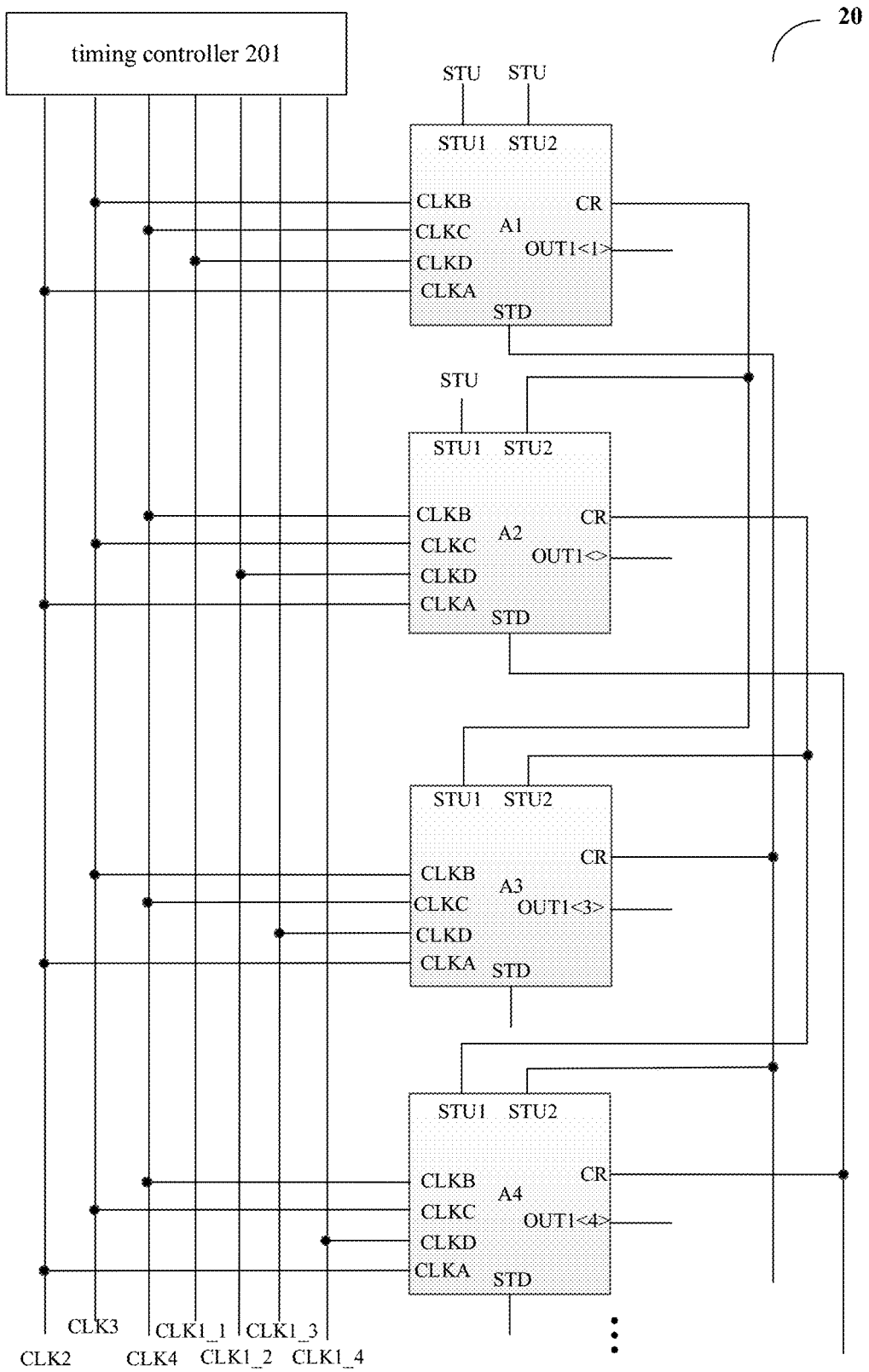
FIG. 9 is a schematic diagram of a gate drive circuit according to some embodiments of the present disclosure.

Some embodiments of the present disclosure provide a gate drive circuit 20, as shown in FIG. 9, the gate drive circuit 20 includes a plurality of cascaded shift register units 10, and any one or more of the shift register units 10 may employ the structure or a modification of the shift register unit 10 provided by the embodiments of the present disclosure. For example, the circuit structure of the shift register unit as shown in FIG. 5, FIG. 7 or FIG. 8 may be employed, and the embodiments of the present disclosure are not limited to this case. It should be noted that only four stages of shift register units (A1, A2, A3 and A4) of the gate drive circuit 20 in the former are schematically illustrated in FIG. 9. For example, the gate drive circuit 20 may be directly integrated on an array substrate of a display device by using the same semiconductor process as the thin film transistor to realize the progressive or interlaced driving function.

As shown in FIG. 9, the gate drive circuit 20 further includes four sub-clock signal lines CLK1_1-CLK1_4 connected with the first clock signal terminals CLKD of the respective stages. In a case where the shift register unit includes the first clock signal terminal CLKD, a first clock signal terminal CLKD of a (4n−3)th (n is an integer greater than 0) stage of shift register unit is connected with a first sub-clock signal line CLK1_1; a first clock signal terminal CLKD of a (4n−2)th stage of shift register unit is connected with a second sub-clock signal line CLK1_2; a first clock signal terminal CLKD of a (4n−1)th stage of shift register unit is connected with a third sub-clock signal line CLK1_3; a first clock signal terminal CLKD of a (4n)th stage of shift register unit is connected with a fourth sub-clock signal line CLK1_4. It should be noted that in different examples, more sub-clock signal lines may be provided for the gate drive circuit according to different configurations. For example, the gate drive circuit may include six, eight, ten, or the like sub-clock signal lines.

As shown in FIG. 9, the gate drive circuit 20 may further include a third clock signal line CLK3 and a fourth clock signal line CLK4. In a case where the shift register unit includes the third clock signal terminal CLKB and the fourth clock signal terminal CLKC, a third clock signal terminal CLKB of a (2n−1)th stage of shift register unit is connected with the third clock signal line CLK3, and a fourth clock signal terminal CLKC of the (2n−1)th stage of shift register unit is connected with the fourth clock signal line CLK4; a third clock signal terminal CLKB of a (2n)th stage of shift register unit is connected with the fourth clock signal line CLK4, and a fourth clock signal terminal CLKC of the (2n)th stage of shift register unit is connected with the third clock signal line CLK3.

As shown in FIG. 9, the gate drive circuit 20 may further include a second clock signal line CLK2, and a second clock signal terminal CLKA of each stage of shift register unit is connected with the second clock signal line CLK2.

As shown in FIG. 9, each shift register unit includes the display control terminal STU1, the blanking control terminal STU2, the first clock signal terminal to fourth clock signal terminal CLKA-CLKD, the display reset terminal STD, the shift output terminal CR and the first scan signal output terminal OUT1 and so on.

A display control terminal STU1 and a blanking control terminal STU2 of a first stage of shift register unit and a display control terminal STU1 of a second stage of shift register unit are all connected with a trigger signal line STU for, for example, receiving a trigger signal STV. For example, except the first stage of shift register unit, a blanking control terminal STU2 of an (n+1)th stage of shift register unit is connected with a shift output terminal CR of an (n)th stage of shift register unit. For example, except the first stage of shift register unit and the second stage of shift register unit, a display control terminal STU1 of an (n+2)th stage of shift register unit is connected with the shift output terminal CR of the (n)th stage of shift register unit. For example, except last two stages of the shift register units, a display reset terminal STD of each stage of shift register unit is connected with a shift output terminal CR of a shift register unit which is spaced apart from each stage of shift register unit by one stage of shift register unit. For example, display reset terminals of the last two stages of the shift register units are connected with a reset line (not shown) to receive a reset signal.

For example, the gate drive circuit 20 may further include a timing controller 201 configured to provide the above respective clock signals to respective stages of the shift register units, and the timing controller 201 may be further configured to provide the trigger signal and the reset signal. It should be noted that the phase relationship between the plurality of clock signals provided by the timing controller 201 may be determined according to actual needs.

For example, the gate drive circuit 20 further includes a plurality of voltage lines to provide a plurality of voltage signals to the respective stages of the shift register units; for example, the voltage signals include relatively high-level signals VDD, VDD_A and VDD_B, and low-level signals VGL1, VGL2 and the like.

For example, in a situation where the display panel is driven by using the gate drive circuit 20, the gate drive circuit 20 may be disposed on one side of the display panel. For example, the display panel includes a plurality of rows of gate lines, and first scan signal output terminals OUT1 of the respective stages of the shift register units in the gate drive circuit 20 may be configured to be sequentially connected with the plurality of rows of gate lines for outputting drive signals. For example, each of two sides of the display panel may be provided with the gate drive circuit 20 to realize bilateral driving. The embodiments of the present disclosure are not limited to the manner in which the gate drive circuit 20 is disposed. For example, the gate drive circuit 20 may be disposed on one side of the display panel for driving gate lines in odd-numbered rows, and another gate drive circuit 20 may be disposed on another side of the display panel for driving gate lines in even-numbered rows.

Figure 10:
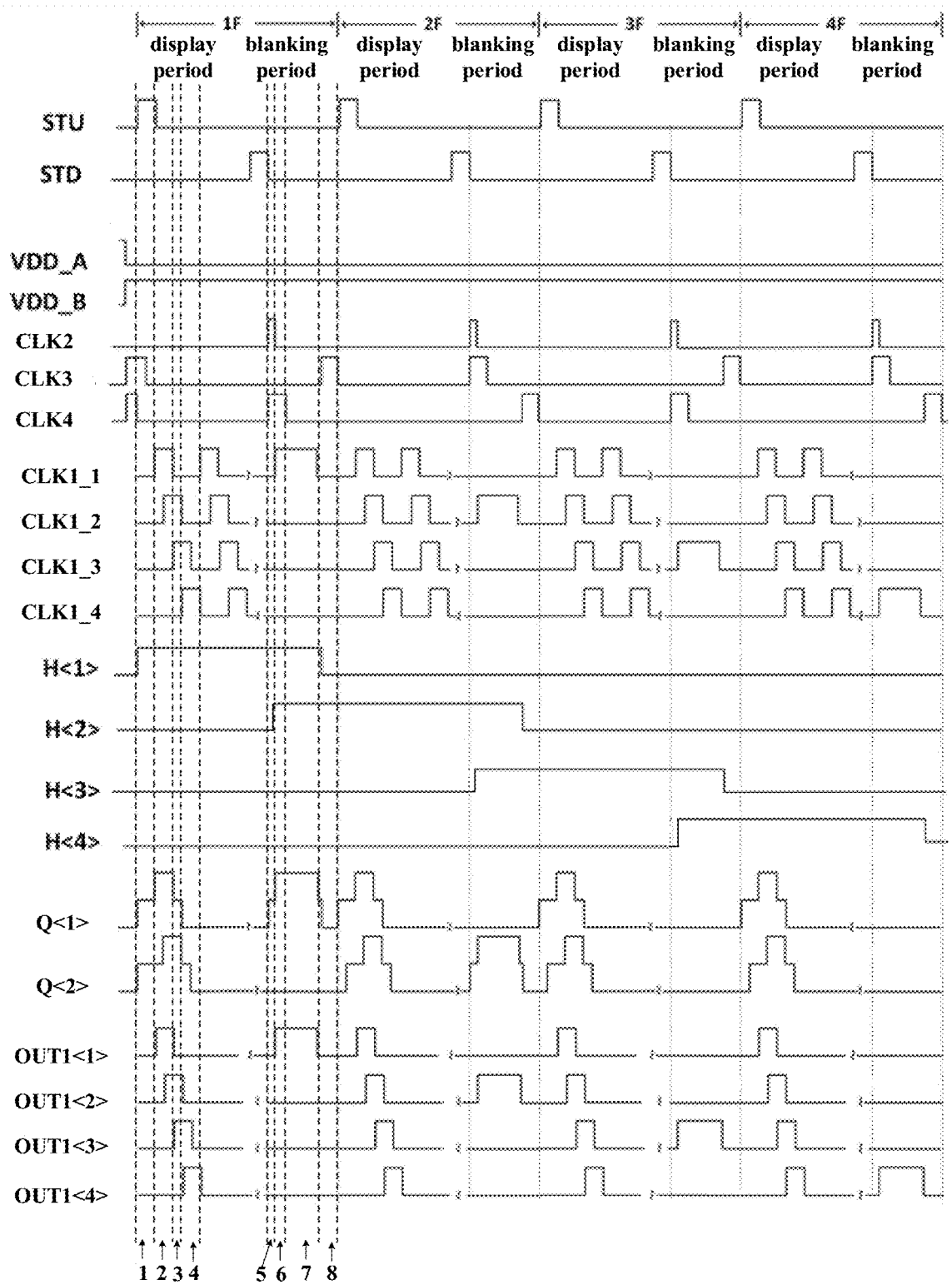
FIG. 10 is a signal timing diagram corresponding to the gate drive circuit as shown in FIG. 9 during operation according to some embodiments of the present disclosure.

FIG. 10 is a signal timing schematic diagram of the gate drive circuit according to some embodiments of the present disclosure. For example, clock signal timings provided by the respective clock signal lines CLK1-CLK4 of the gate drive circuit as shown in FIG. 9 can adopt the signal timing as shown in FIG. 10, to realize the function of outputting the gate scan signals row by row by the gate drive circuit 20.

In FIG. 10, Q<1> and Q<2> respectively denote the first node in the first stage of shift register unit and the first node in the second stage of shift register unit in the gate drive circuit 20. H<1> to H<4> respectively denote the second node in first stage of shift register unit to fourth stage of shift register unit in the gate drive circuit 20. Similarly, OUT1<1>, OUT1<2>, OUT1<3> and OUT1<4> represent the first scan signal output terminals of the first, second, third and fourth stage of shift register units in the gate drive circuit 20, respectively. 1F, 2F, 3F and 4F represent the first frame, the second frame, the third frame and the fourth frame, respectively. It should be noted that, for clarity and conciseness, the electric potential of the shift output terminal CR is same as that of the first scan signal output terminal OUT1 in each stage of shift register unit, and thus is not shown in FIG. 10.

It should be noted that the signal levels in the signal timing diagram as shown in FIG. 10 are only schematic and do not represent true level values.

Next, the operation principle of the gate drive circuit 20 as shown in FIG. 9 will be described with reference to the signal timing chart as shown in FIG. 10. For example, in this example, the circuit structure as shown in FIG. 8 is taken as an example for the shift register unit, but the embodiments of the present disclosure are not limited to this case.

A hird clock signal terminal CLKB of a shift register unit 10 in an odd row is connected with the third clock signal line CLK3, and a third clock signal terminal CLKB of a shift register unit 10 in an even row is connected with the fourth clock signal line CLK4. Referring to FIG. 10, the third clock signal line CLK3 and the fourth clock signal line CLK4 are alternately at a high level at the end of the blanking period of each frame, so as to alternately input the high level to the third clock signal terminal CLKB of the shift register unit 10 in the odd-numbered row and the third clock signal terminal CLKB of the shift register unit 10 in the even-numbered row, thereby alternately resetting the second node H and the first node Q of the shift register unit 10 in the odd-numbered row and the second node H and the first node Q of the shift register unit 10 in the even-numbered row. In a situation where a third clock signal terminal CLKB of an (n)th row of shift register unit 10 is at a high level, a fourth clock signal terminal CLKC of a (n+1)th row of shift register unit 10 is at a high level, and the second clock signal terminal CLKA is at a low level at this time to turn off the fourth transistor M4, so that a level of a first node Q of a (n+1)th row of shift register unit 10 does not become a high level due to the high level of the fourth clock signal terminal CLKC, thereby avoiding output anomalies.

In a display period of a first frame 1F, the operation process of the first stage of shift register unit A1 is described as follows.

In a first period 1, the display control terminal STU1 and the blanking control terminal STU2 of the first stage of shift register unit A1 are both connected with the trigger signal line STU, so the display control terminal STU1 and the blanking control terminal STU2 are both input with a high level at the beginning; at the same time, because the third clock signal terminal CLKB (which is connected with the third clock signal line CLK3) is input with a high level, the second transistor M2 is turned on, and a second node H<1> is pulled up to a high level (for example, the first level) and is stored by the first capacitor C1.

Meanwhile, the phase inverter in the anti-crosstalk circuit 300 outputs the inverted signal (i.e., the second level which is a low level) of a level of the second node H<1> to the gate electrode of the first transistor M1, so the first transistor M1 is turned off and does not affect the level of the second node H<1>.

Then, the third clock signal terminal CLKB is input with a low level, the second transistor M2 is turned off, the display control terminal STU1 continues to be input with a high level, and the fifth transistor M5 is turned on due to the high level input by the display control terminal STU1, so that the high-level signal of the second voltage terminal VDD can continue to charge a first node Q<1> through the fifth transistor M5, so that the first node Q<1> is pulled up to a high electric potential and stored by the second capacitor C2.

At this period, the sixth transistor M6 and the seventh transistor M7 are turned on under control of the level of the first node Q<1>, and because the first clock signal terminal CLKD (which is connected with the first sub-clock signal line CLK1_1) is input with a low-level signal at this time, the shift output terminal CR and the first scan signal output terminal OUT1<1> both output a low-level signal.

In a second period 2, the first clock signal terminal CLKD is input with a high-level signal, and an electric potential of the first node Q<1> is further pulled high due to the bootstrap effect of the second capacitor C2, so the sixth transistor M6 and the seventh transistor M7 remain being turned on, and thus the shift output terminal CR and the first scan signal output terminal OUT1<1> both output a high-level signal. For example, a high-level signal output from the shift output terminal CR may be used for scan shift between a previous stage of shift register unit and a next stage of shift register unit, and a high-level signal output from a first scan signal output terminal OUT1<1> may be used for driving sub-pixel units in the display panel to perform display.

In a third period 3, the first clock signal terminal CLKD is input with a low-level signal, and the shift output terminal CR and the first scan signal output terminal OUT1<1> may be discharged through the first clock signal terminal CLKD, thereby completing a reset of the shift output terminal CR and the first scan signal output terminal OUT1<1>. Because the shift output terminal CR and the first scan signal output terminal OUT1<1> are reset to a low level, the electric potential of the first node Q<1> is decreased by an amplitude due to the coupling effect between the transistors.

At the same time, the display reset terminal STD of the first stage of shift register unit is connected with the shift output terminal CR of a fourth stage of shift register unit, a shift output terminal CR of the fourth stage of shift register unit does not output a high-level signal at this time, so the first node Q<1> is not pulled down and thus the first node Q<1> can be kept at a higher level.

In a fourth period 4, the shift output terminal CR of the fourth stage of shift register unit A4 outputs a high level, so that the display reset terminal STD of the first stage of shift register unit A1 is input with a high-level signal, the twelfth transistor M12 is turned on, and thus the first node Q<1> is pulled down to a low level to complete the reset of the first node Q<1>. At this time, the tenth transistor M10 is turned off in response to the level of the first node Q<1>; because the ninth transistor M9 is turned on, the third node QB is pulled up to a high level, and thus the eleventh transistor M11 is turned on under control of the third node QB, to further perform noise reduction on the first node Q<1>.

Through the above process, the electric potential change of the first node Q<1> of the first stage of shift register unit A1 exhibits a "tower shape". The pull-up and reset of an output signal of the shift output terminal CR are realized by the sixth transistor M6, the pull-up and reset of an output signal of the first scan signal output terminal OUT1<1> are realized by the seventh transistor M7, both the thirteenth transistor M13 and the fourteenth transistor M14 have an auxiliary effect of pulling down the output signal of the shift output terminal CR and the output signal of the first scan signal output terminal OUT1<1>, so that a size of the thirteenth transistor M13 and a size of the fourteenth transistor M14 can be reduced, and it is beneficial to reduce the area of the circuit layout.

In the display period of the first frame, because the second clock signal terminal CLKA is always kept to be a low level, the fourth transistor M4 remains in a turn-off state, and thus the fourth transistor M4 prevents the high level pre-stored at the second node H<1> from affecting the display period (for example, the level of the first node Q<1>).

After the first stage of shift register unit A1 drives the sub-pixels in the first row in the display panel to complete display, similarly, the second stage of shift register unit, the third stage of shift register unit and other shift register units drive sub-pixel units in the display panel row by row to complete one frame display drive. At this point, the display period of the first frame ends.

In a blanking period of the first frame 1F, the operation process of the first stage of shift register unit A1 is described as follows.

In a fifth period 5, the second node H<1> maintains a high level of the display period due to the storage of the first capacitor C1, the second clock signal terminal CLKA and the fourth clock signal terminal CLKC are input with a high-level signal at the beginning, the third transistor M3 and the fourth transistor M4 are turned on, so that the high level of the fourth clock signal terminal CLKC can charge the first node Q<1> to pull up the first node Q<1> to a high electric potential. The tenth transistor M10 is turned on under control of the first node Q<1>, and thus the third node QB is pulled down to a low level.

In a sixth period 6, the second clock signal terminal CLKA is input with a low-level signal, and the fourth transistor M4 is turned off. The first clock signal terminal CLKD (which is connected with the first sub-clock signal line CLK1_1) is input with a high-level signal, the electric potential of the first node Q<1> is further pulled high due to the bootstrap effect of the second capacitor C2, the sixth transistor M6 and the seventh transistor M7 are turned on, and the high-level signal input by the first clock signal terminal CLKD can be output to the shift output terminal CR and the first scan signal output terminal OUT1<1>. For example, the signal output by the first scan signal output terminal OUT1<1> may be used to drive the sense transistor for compensation in the sub-pixel unit in the display panel to achieve external compensation.

At the same time, because a third clock signal terminal CLKB of the second stage of shift register unit A2 is connected with the fourth clock signal line CLK4, the blanking control terminal STU2 of the second stage of shift register unit A2 is connected with the shift output terminal CR of the first stage of shift register unit A1, so the second transistor M2 in the second stage of shift register unit is turned on, so that a second node H<2> in the second stage of shift register unit A2 is pulled up to a high level (which is, for example, the first level). Meanwhile, a phase inverter in an anti-crosstalk circuit 300 in the second stage of shift register unit A2 outputs an inverted signal (i.e., the second level) of a level of the second node H<2> to the gate electrode of the first transistor M1, so that the first transistor M1 is turned off and does not affect a level of the second node H<2>.

In a seventh period 7, in a situation where the second node H<2> in the second stage of shift register unit A2 is sufficiently written with a high electric potential, the fourth clock signal line CLK4 is input with a low-level signal. At the same time, the first clock signal terminal CLKD continues to be input with a high level, and the first node Q<1> is still at the high level, so the shift output terminal CR and the first scan signal output terminal OUT1<1> of the first stage of shift register unit A1 keep outputting a high-level signal. During this process, the fourth transistor M4 remains in a turn-off state all the time, so that the first node Q<1> can be prevented from leaking electricity through the fourth transistor M4.

In an eighth period 8, that is, in a final period of the blanking period, the third clock signal line CLK3 is input with a high-level signal, so that the fifteenth transistor M15 may be turned on; due to that the third clock signal terminal CLKB of each odd-numbered stage of shift register unit is connected with the third clock signal line CLK3, the reset of the second node H in each odd-numbered stage of shift register unit can be completed, in particular, the reset of the second node H <1> of the first stage of shift register unit. Because the threshold voltage of the transistor may drift in a situation where the transistor is applied with a positive voltage, the above manner can realize that the second node H needs to be kept at the positive voltage for a short time, thereby reducing the time during which the threshold voltage of the transistor drifts, and improving the reliability of the transistor.

For example, after the second node H is reset, the level of the second node H changes from the first level (high level) to the second level (low level); at this time, for example, in the illustrated example as shown in FIG. 5, the phase inverter in the anti-crosstalk circuit 300 outputs the inverted signal (i.e., the first level) of the level of the second node H to the gate electrode of the first transistor M1, so that the first transistor M1 is turned on, and thus the second node H is connected with the first voltage terminal VGL1, thereby avoiding crosstalk to the level of the second node H in a situation where the second clock signal and the fourth clock signal are at a high level in a subsequent step, and thus, for example, the level of the second node H is changed from the second level to the first level or other level close to the first level, so that the isolation sub-circuit 230 is turned on to pull up the first node Q, causing wrong output of a non-display period scan signal.

At this point, the driving timing sequence of the first frame ends.

In a display period of a second frame, the gate drive circuit 20 repeats the same operation as the display period of the first frame, and details are not described herein again.

In a blanking period of the second frame, for the second stage of shift register unit, because the fourth clock signal terminal CLKC is connected with the third clock signal line CLK3, the second clock signal terminal CLKA and the fourth clock signal terminal CLKC of the second stage of shift register unit are input with a high-level signal at the beginning of the blanking period, and the third transistor M3 and the fourth transistor M4 are turned on, so that the high level input by the fourth clock signal terminal CLKC can charge a first node Q <2> to pull up the first node Q<2> to a high electric potential. Then, in a situation where the second sub-clock signal line CLK1_2 is input with a high-level signal, the shift output terminal CR and the first scan signal output terminal OUT1<2> output a high-level signal and meanwhile a second node H<3> in a third stage of shift register unit A3 is charged. In a final period of the blanking period of the second frame, the fourth clock signal line CLK4 is input with a high-level signal; and because the third clock signal terminal CLKB of each even-numbered stage of shift register unit is connected with the fourth clock signal line CLK4, the reset of the second node H and the first node Q of each even-numbered stage of shift register unit is completed.

At this point, the driving timing sequence of the second frame ends. For the driving of the gate drive circuit in a third frame, a fourth frame, a fifth frame and more periods, reference may be made to the above description, and details are not described herein again.

As described above, during a blanking period of each frame, the gate drive circuit outputs a drive signal for the sense transistor in the sub-pixel unit in the display panel, and a drive signal is sequentially supplied row by row. For example, in the blanking period of the first frame, the gate drive circuit outputs the drive signal for a first row of sub-pixel units in the display panel; and in the blanking period of the second frame, the gate drive circuit outputs a drive signal for a second row of sub-pixel units in the display panel, et cetera, so that the row-by-row sequential compensation is completed.

As shown in FIG. 10, waveforms of the first sub-clock signal line CLK1_1, the second sub-clock signal line CLK1_2, the third sub-clock signal line CLK1_3 and the fourth sub-clock signal line CLK1_4 in the display period of one frame are sequentially overlapped with 50% of an effective pulse width, and the waveforms in the blanking period of each frame are sequentially shifted. Waveforms of the output signals of the first scan signal output terminals OUT1 of the first stage of shift register unit to fourth stage of shift register unit A1-A4 in the display period of one frame are sequentially overlapped with 50% of the effective pulse width, and the waveforms in the blanking period of each frame are sequentially shifted. The output signals of the gate drive circuit 20 overlap in the display period, so that the pre-charging function can be realized, the charging time of the pixel circuit can be shortened, and the high refresh rate is facilitated.

It should be noted that, in various embodiments of the present disclosure, the gate drive circuit 20 is not limited to the cascading manner described in FIG. 9, or may be any applicable cascading manner. In a situation where the cascading manner or the clock signal is changed, overlapping portions of the waveforms of the output signals of the first scan signal output terminals of the first stage of shift register unit to fourth stage of shift register unit A1-A4 in the display period may be changed correspondingly; for example, an overlapping rate is 33% or 0% (i.e. no overlapping portion) to meet a variety of application needs.

Figure 11:
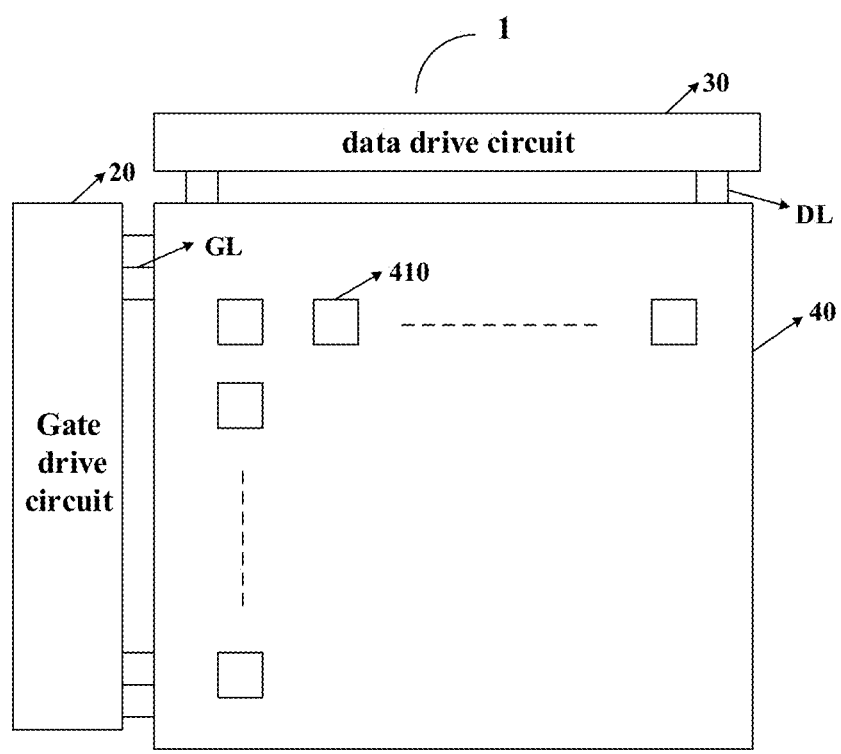
FIG. 11 is a schematic diagram of a display device according to some embodiments of the present disclosure.

The embodiments of the present disclosure further provide a display device 1, as shown in FIG. 11, the display device 1 includes the gate drive circuit 20 provided by the embodiments of the present disclosure, and the display device 1 further includes a display panel 40 including an array including a plurality of sub-pixel units 410. For example, the display device 1 may further include a data drive circuit 30. The data drive circuit 30 is configured for providing a data signal to the pixel array; the gate drive circuit 20 is configured for providing a drive signal to the pixel array, and for example, the drive signal can drive a scan transistor and a sense transistor in the sub-pixel unit 410. The data drive circuit 30 is electrically connected with the sub-pixel unit 410 through a data line DL, and the gate drive circuit 20 is electrically connected with the sub-pixel unit 410 through a gate line GL.

It should be noted that the display device 1 in the embodiments may be any product or component having a display function, such as a liquid crystal panel, a liquid crystal television, a display, an OLED panel, an OLED television, an electronic paper display device, a mobile phone, a tablet computer, a notebook computer, a digital photo frame, a navigator, and the like.

For the technical effects of the display device 1 provided by the embodiments of the present disclosure, reference may be made to the corresponding description of the gate drive circuit 20 in the above embodiments, and details are not described herein again.

The embodiments of the present disclosure also provide a driving method that can be used to drive the shift register unit 10 provided by the embodiments of the present disclosure; for example, in some examples, the driving method includes the following operations.

In a situation where the second node H is at the second level, the transition of the level of the second node H to the first level is prevented by the anti-crosstalk circuit 300.

For example, in other examples, the driving method further includes the following steps.

The second input signal is input to the first node Q through the second input circuit 200 in a situation where the second node H is at the first level.

The input of the second input signal to the first node Q is stopped in a situation where the second node H is at the second level.

The output signal is output to the output terminal OUT under control of the level of the first node Q.

For example, in other examples, the driving method further includes the following steps.

By the first input circuit, the first input signal is input to the first node Q in response to the first control signal.

The output signal is output to the output terminal OUT under control of the level of the first node Q.

For the technical effects of the driving method of the shift register unit 10 provided by the embodiments of the present disclosure, reference may be made to the corresponding description of the shift register unit 10 in the above embodiments, and details are not described herein again.

There are a few points to be explained as follows.

(1) The drawings of the embodiments of the present disclosure relate only to the structures mentioned in the embodiments of the present disclosure, and other structures can be referred to general designs.

(2) In the case of no conflict, the embodiments of the present disclosure and the features in the embodiments can be combined with each other to obtain a new embodiment.

What are described above is related to the illustrative embodiments of the disclosure only and not limitative to the scope of the disclosure; the scopes of the disclosure are defined by the accompanying claims.

What is claimed is:

1. A shift register unit, comprising a first input circuit, a second input circuit, an output circuit, and an anti-crosstalk circuit,
    wherein the first input circuit is connected with a first node and configured to input a first input signal to the first node in response to a first control signal;
    the second input circuit is connected with the first node and a second node, and configured to input a second input signal to the first node in a situation where the second node is at a first level and to stop inputting the second input signal to the first node in a situation where the second node is at a second level;
    the output circuit is connected with the first node, and configured to output or not output an output signal to an output terminal under control of a level of the first node; and
    the anti-crosstalk circuit is connected with the second node, and is configured to prevent a level of the second node from becoming the first level in a situation where the second node is at the second level,
    wherein the anti-crosstalk circuit comprises a first transistor,
    a gate electrode of the first transistor is connected with the second node, a first electrode of the first transistor is connected with the second node, and a second electrode of the first transistor is connected with a first voltage terminal to receive a first voltage, and the first transistor is configured to be turned on in a situation where the second node is at the second level.

2. The shift register unit according to claim 1, wherein the second input circuit comprises a charging sub-circuit, a storage sub-circuit, and an isolation sub-circuit;
    the charging sub-circuit is connected with the second node and configured to input a second control signal to the second node in response to a third clock signal;
    the storage sub-circuit is connected with the second node and configured to store a level of the second control signal input by the charging sub-circuit; and
    the isolation sub-circuit is connected with the second node and the first node, and configured to input the second input signal to the first node under control of the first level of the second node and a second clock signal.

3. The shift register unit according to claim 2,
    wherein the charging sub-circuit comprises a second transistor, a gate electrode of the second transistor is connected with a third clock signal terminal to receive the third clock signal, a first electrode of the second transistor is connected with a blanking control terminal to receive the second control signal, and a second electrode of the second transistor is connected with the second node;
    the storage sub-circuit comprises a first capacitor, a first terminal of the first capacitor is connected with the second node, and a second terminal of the first capacitor is connected with the first voltage terminal to receive the first voltage; and
    the isolation sub-circuit comprises a third transistor and a fourth transistor, a gate electrode of the third transistor is connected with the second node, a first electrode of the third transistor is connected with a fourth clock signal terminal to receive a fourth clock signal, the fourth clock signal is used as the second input signal, a second electrode of the third transistor is connected with a first electrode of the fourth transistor, a gate electrode of the fourth transistor is connected with a second clock signal terminal to receive the second clock signal, and a second electrode of the fourth transistor is connected with the first node.

4. The shift register unit according to claim 1, wherein the first input circuit comprises a fifth transistor,
    a gate electrode of the fifth transistor is connected with a display control terminal to receive the first control signal, a first electrode of the fifth transistor is connected with a second voltage terminal to receive a second voltage, the second voltage is used as the first input signal, and a second electrode of the fifth transistor is connected with the first node.

5. The shift register unit according to claim 1, wherein the output terminal comprises a shift output terminal and at least one scan signal output terminal.

6. The shift register unit according to claim 5, wherein the output circuit comprises a sixth transistor, a seventh transistor, and a second capacitor,
    a gate electrode of the sixth transistor is connected with the first node, a first electrode of the sixth transistor is connected with a first clock signal terminal to receive a first clock signal, the first clock signal is used as the output signal, and a second electrode of the sixth transistor is connected with the shift output terminal;
    a gate electrode of the seventh transistor is connected with the first node, a first electrode of the seventh transistor is connected with the first clock signal terminal to receive the first clock signal, the first clock signal is used as the output signal, and a second electrode of the seventh transistor is connected with the at least one scan signal output terminal; and
    a first terminal of the second capacitor is connected with the first node, and a second terminal of the second capacitor is connected with the shift output terminal.

7. The shift register unit according to claim 1, further comprising a first node noise reduction circuit, a display reset circuit, a third node control circuit, and an output noise reduction circuit,
    wherein the first node noise reduction circuit is configured to perform noise reduction on the first node under control of a level of a third node;
    the display reset circuit is configured to reset the first node in response to a display reset signal;
    the third node control circuit is configured to control the level of the third node under control of the level of the first node; and
    the output noise reduction circuit is configured to perform noise reduction on the output terminal under the control of the level of the third node.

8. The shift register unit according to claim 1, further comprising a blanking reset circuit, wherein the blanking reset circuit is configured to reset the first node in response to a blanking reset signal.

9. The shift register unit according to claim 1, further comprising a first node electricity-leakage prevention circuit, wherein the first node electricity-leakage prevention circuit is configured to control a level of a first electricity-leakage prevention node under the control of the level of the first node.

10. The shift register unit according to claim 1, further comprising a first node electricity-leakage prevention circuit,
wherein the first node electricity-leakage prevention circuit is configured to control a level of a first electricity-leakage prevention node in a situation where the second node is at the first level, to reduce electricity-leakage of the second node via the second input circuit and the anti-crosstalk circuit.

11. A gate drive circuit, comprising a plurality of cascaded shift register units, wherein each of the plurality of cascaded shift register units is the shift register unit according to claim 1.

12. The gate drive circuit according to claim 11,
wherein a display control terminal of an (n+2)th stage of shift register unit is connected with a shift output terminal of an (n)th stage of shift register unit; and
a blanking control terminal of an (n+1)th stage of shift register unit is connected with the shift output terminal of the (n)th stage of shift register unit, and
n is an integer greater than zero.

13. A display device, comprising the gate drive circuit according to claim 11.

14. A driving method of the shift register unit according to claim 1, comprising:
preventing the level of the second node from becoming the first level by the anti-crosstalk circuit in a situation where the second node is at the second level.

15. The driving method according to claim 14, further comprising:
inputting the second input signal to the first node by the second input circuit in a situation where the second node is at the first level;
stopping inputting the second input signal to the first node in a situation where the second node is at the second level; and
outputting the output signal to the output terminal under control of the level of the first node.

16. The driving method according to claim 14, further comprising:
inputting the first input signal to the first node by the first input circuit in response to the first control signal; and
outputting the output signal to the output terminal under the control of the level of the first node.

* * * * *